(12) United States Patent
Keller et al.

(10) Patent No.: US 11,640,206 B1
(45) Date of Patent: May 2, 2023

(54) WEARABLE DEVICE WITH FLUID-BASED CIRCUITS AND STRETCH-SENSITIVE MATERIALS, AND SYSTEMS INCLUDING THE WEARABLE DEVICE USED IN CONJUNCTION WITH A VIRTUAL-REALITY HEADSET

(71) Applicant: META PLATFORMS TECHNOLOGIES, LLC, Menlo Park, CA (US)

(72) Inventors: Sean Jason Keller, Kirkland, WA (US); Tristan Thomas Trutna, Seattle, WA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 350 days.

(21) Appl. No.: 16/918,663

(22) Filed: Jul. 1, 2020

Related U.S. Application Data

(63) Continuation of application No. 15/390,882, filed on Dec. 27, 2016, now Pat. No. 10,732,712.

(51) Int. Cl.
  *G06F 3/01* (2006.01)
  *F16K 99/00* (2006.01)
  *B81C 1/00* (2006.01)

(52) U.S. Cl.
  CPC .......... *G06F 3/016* (2013.01); *B81C 1/00119* (2013.01); *F16K 99/0049* (2013.01);
  (Continued)

(58) Field of Classification Search
  CPC ...... G06F 3/016; G06F 3/014; F16K 99/0049; F16K 2099/008; F16K 2099/0082;
  (Continued)

(56) References Cited

U.S. PATENT DOCUMENTS

| 10,732,712 B2 | 8/2020 | Keller et al. |
| 2003/0087195 A1 | 5/2003 | Kim et al. |

(Continued)

FOREIGN PATENT DOCUMENTS

| CN | 110036495 A | 7/2019 |
| DE | 44 22 941 A1 | 1/1996 |

(Continued)

OTHER PUBLICATIONS

Vyawahare S., et al., "Electronic Control of Elastomeric Microfluidic Circuits with Shape Memory Actuators," The Royal Society of Chemistry, Oct. 2008, vol. 8 (9), pp. 1530-1535.

(Continued)

*Primary Examiner* — Phuong H Nguyen
(74) *Attorney, Agent, or Firm* — Morgan, Lewis & Bockius LLP

(57) ABSTRACT

A method for large scale integration of haptic devices is described. The method comprises forming a first elastomer layer of a large scale integration (LSI) device on a substrate according to a specified manufacturing process, the first elastomer layer having a plurality of fluid based circuits, the first elastomer layer adhering to a plurality of formation specifications. The method further comprises curing the first elastomer layer. Additionally, one or more additional elastomer layers of the LSI device are formed with the first elastomer layer according to the specified manufacturing process, the one or more additional elastomer layers having a plurality of fluid based circuits, the one or more additional elastomer layers adhering to the plurality of formation specifications.

20 Claims, 12 Drawing Sheets

Fluidic Circuit Stack utilizing Large Scale Integration (LSI) 110

- Actuator Layer 160 (Fluidic Actuators)
- Third Via Layer 155 (Fluidic Via)
- Source/Drain Layer 150 (Fluidister Source/Drain Routing)
- Second Via Layer 145 (Fluidic Via)
- Gate Layer 140 (Fluidister Gate and Routing)
- First Via Layer 135 (Fluidic Via)
- Sensing Layer 130 (Fluidic Sensing and Routing)
- Conductive Polymer Layer 125 (Carbon nanotube (CNT) doped Polydimethylsiloxane (PDMS))
- Substrate 120 (Polydimethylsiloxane (PDMS))

(52) U.S. Cl.
CPC .............. *G06F 3/011* (2013.01); *G06F 3/014* (2013.01); *B81B 2201/0264* (2013.01); *B81B 2201/032* (2013.01); *B81B 2201/058* (2013.01); *B81B 2207/012* (2013.01); *B81C 2201/034* (2013.01); *F16K 2099/008* (2013.01); *F16K 2099/0082* (2013.01)

(58) Field of Classification Search
CPC ...... B81B 2201/0264; B81B 2201/032; B81B 2201/058; B81B 2207/012; B81C 2201/034; B81C 1/00119
See application file for complete search history.

(56) References Cited

U.S. PATENT DOCUMENTS

| | | | |
|---|---|---|---|
| 2004/0112442 A1 | 6/2004 | Maerkl et al. | |
| 2005/0072946 A1 | 4/2005 | Studer et al. | |
| 2008/0185057 A1 | 8/2008 | Prakash et al. | |
| 2009/0257920 A1 | 10/2009 | Facer et al. | |
| 2012/0132288 A1 | 5/2012 | Weitz et al. | |
| 2012/0182135 A1* | 7/2012 | Kusuura | G06F 3/016 340/407.1 |
| 2013/0114120 A1 | 5/2013 | Jung et al. | |
| 2013/0333094 A1 | 12/2013 | Rogers et al. | |
| 2014/0061049 A1 | 3/2014 | Lo et al. | |
| 2014/0238153 A1 | 8/2014 | Wood et al. | |
| 2014/0290373 A1 | 10/2014 | Brettschneider et al. | |
| 2015/0088043 A1 | 3/2015 | Goldfield et al. | |
| 2015/0277563 A1 | 10/2015 | Huang et al. | |
| 2016/0238040 A1 | 8/2016 | Gallo et al. | |
| 2016/0363997 A1* | 12/2016 | Black | G06F 3/014 |
| 2017/0300115 A1* | 10/2017 | Kerr | G06F 3/016 |
| 2018/0158367 A1 | 6/2018 | Russomanno et al. | |

FOREIGN PATENT DOCUMENTS

| | | |
|---|---|---|
| EP | 1 065 378 A2 | 3/2001 |
| EP | 3 343 325 A1 | 7/2018 |
| JP | 2006-501056 A | 1/2006 |
| JP | 2020-504822 A | 2/2020 |
| KR | 10-2019-0092381 A | 8/2019 |
| WO | 2004/028955 A2 | 4/2004 |
| WO | 2013/126483 A1 | 8/2013 |
| WO | 2015/002850 A1 | 1/2015 |
| WO | 2016/205375 A1 | 12/2016 |
| WO | 2018/125246 A1 | 7/2018 |

OTHER PUBLICATIONS

Decision to Grant a Patent received for Japanese Patent Application Serial No. 2019-534867 dated Nov. 24, 2020, 5 pages (Including English Translation).
Communication pursuant to Article 94(3) EPC received for EP Patent Application Serial No. 17201893.9 dated Sep. 30, 2020, 7 pages.
International Search Report and Written Opinion received for PCT Application Serial No. PCT/US2016/069633 dated Sep. 15, 2017, 19 pages.
European Extended Search Report received for EP Patent Application Serial No. 17201893 9 dated Apr. 4, 2018, 13 pages.
Non-Final Office Action received for U.S. Appl. No. 15/390,882 dated Jun. 1, 2018, 21 pages.
Final Office Action received for U.S. Appl. No. 15/390,882 dated Jan. 4, 2019, 17 pages.
Communication pursuant to Article 94(3) EPC received for EP Patent Application Serial No. 17201893. 9 dated May 24, 2019, 9 pages.
Non-Final Office Action received for U.S. Appl. No. 15/390,882 dated Sep. 19, 2019, 25 pages.
Final Office Action received for U.S. Appl. No. 15/390,882 dated Jan. 17, 2020, 36 pages.
Notice of Allowance received for U.S. Appl. No. 15/390,882 dated Apr. 8, 2020, 27 pages.
Notice of Reasons for Refusal received for Japanese Patent Application Serial No. 2019-534867 dated Aug. 11, 2020, 4 pages (Including English Translation).
International Preliminary Report on Patentability received for PCT Application Serial No. PCT/US2016/069633 dated Jul. 11, 2019, 16 pages.
Notification of Reason for Rejection dated Nov. 2, 2021 for Japanese Application No. 2020-206494, filed Dec. 31, 2016, 4 pages.
Non-Final Office Action dated Jun. 7, 2022 for U.S. Appl. No. 17/591,550, filed Feb. 2, 2022, 15 pages.

* cited by examiner

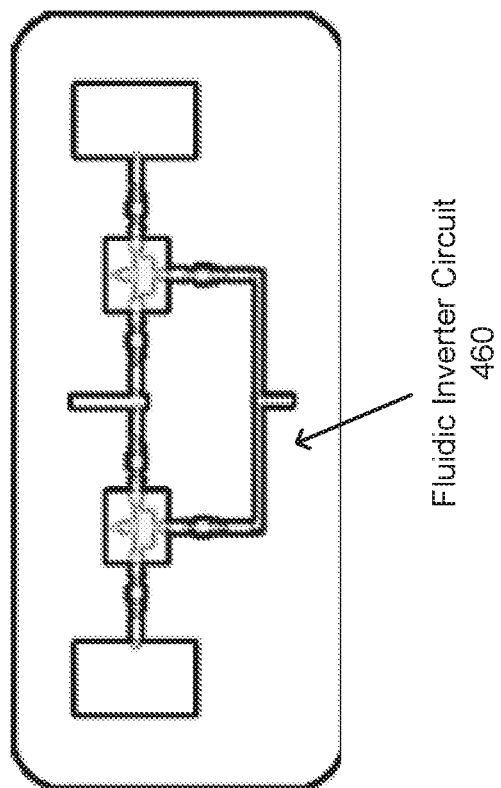
FIG. 5A
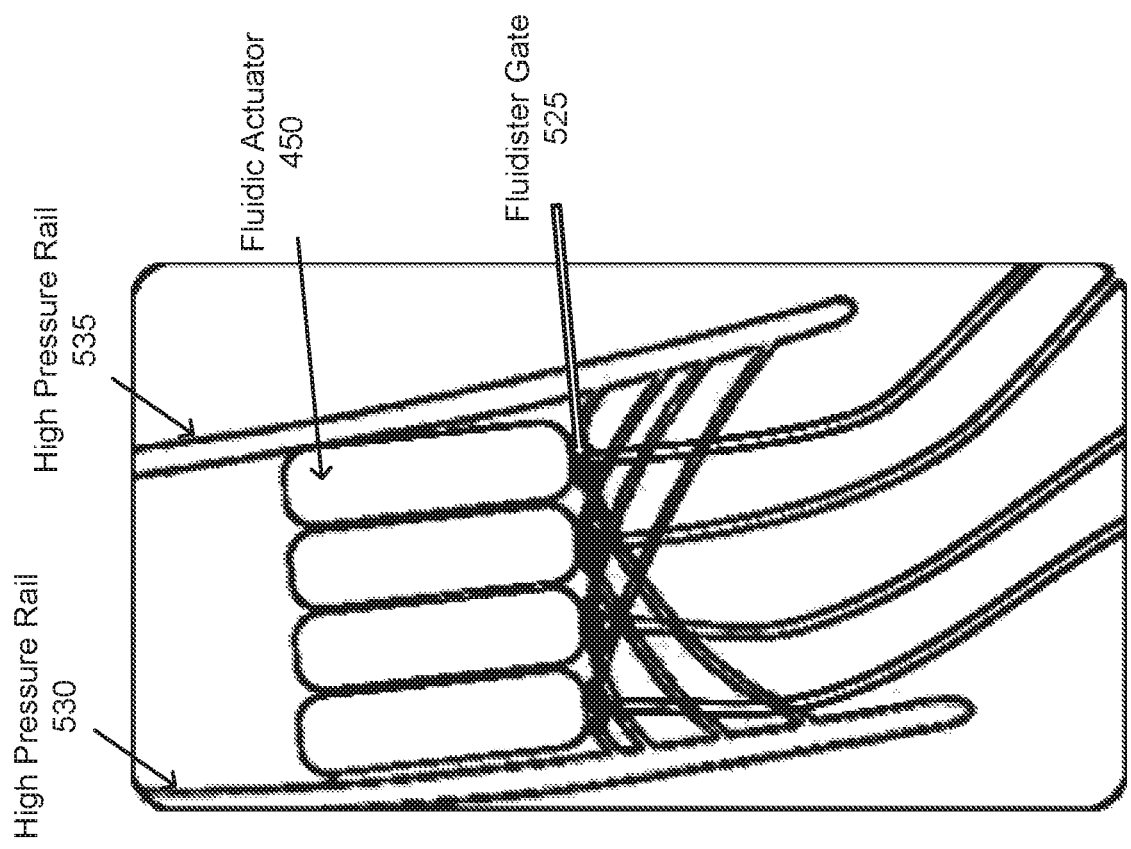

WEARABLE DEVICE WITH FLUID-BASED CIRCUITS AND STRETCH-SENSITIVE MATERIALS, AND SYSTEMS INCLUDING THE WEARABLE DEVICE USED IN CONJUNCTION WITH A VIRTUAL-REALITY HEADSET

BACKGROUND

The present disclosure generally relates to fluidically-controlled haptic devices for virtual reality (VR) systems and more specifically to integrating a plurality of fluidic haptic devices together with electrical and electronic devices in VR systems using large scale integration.

Virtual reality (VR), augmented reality (AR), or mixed reality (MR) provide a simulated environment created by computer technology and presented to a user, such as through a VR system. In some VR systems wearable devices (e.g., glove) allow a user to interact with virtual objects. Circuitry on such wearable devices can be complex, bulky, and/or heavy, as such circuitry may include sensors and actuators and other devices to enhance tactile, kinesthetic, and other experiences for the user of the wearable device in the VR setting. The implementation of complex assemblies in a wearable device may also be limited by physical constraints, such as the physical dimensions of a glove used in VR, by thermal dissipation limits, power distribution, and/or energy storage constraints. As a result, conventional wearable devices can detract from a user's experience with a VR system.

SUMMARY

Embodiments herein describe a large scale integration (LSI) device formed according to various formation specifications and using a specified manufacturing process. The LSI device may include fluidic and non-fluidic circuits, and may be used as a component in a VR/AR/MR device. For example, the LSI device may be part of the control, sensing, and actuation components of a haptic glove, and may comprise layers of fluidic and non-fluidic circuits. These layers may be composed of various polymer and fabric materials, and include channels for the flow of fluid and other fluidic and non-fluidic components.

With the use of the design rules, the LSI device may achieve a high efficiency and compactness. In particular, by adhering to these various design goals, multiple advantages may be realized. First, using fluid actuation systems allow for sufficiently high force force-density with low thermal dissipation compared to other systems. Additionally, the large scale integration topology and design rules addresses and allows for control of a large numbers of devices (e.g., fluid, electronic, and other devices). Furthermore, a soft polymer implementation of the system allows for mass manufacturing.

Examples of these design rules may include minimum and maximum operating pressures and voltages, minimum layer thickness of the LSI device, minimum hardness levels, maximum propagation delay of signals, thermal design requirements, and so on. The LSI device may be manufactured using various highly scalable techniques, such as lost wax casting, roll to roll manufacturing, high speed stencil and screen printing techniques, the use of curing agents, and so on.

In one embodiment, the LSI device is formed by forming a first elastomer layer of a large scale integration (LSI) device on a substrate according to a specified manufacturing process, the first elastomer layer having a plurality of fluid based circuits, the first elastomer layer adhering to a plurality of formation specifications. This first layer is cured, and one or more additional elastomer layers of the LSI device are formed with the first elastomer layer according to the specified manufacturing process, the one or more additional elastomer layers having a plurality of fluid based circuits (and electronic circuits), the one or more additional elastomer layers adhering to the plurality of formation specifications.

In one embodiment, the LSI device includes a first layer of a polymer substrate. The LSI device further includes a sensing layer disposed on a surface of the polymer substrate, the sensing layer being an elastomer having channels for the operation of fluid-based sensing and routing circuits in addition to elastomeric electrically resistive and/or capacitive sensing circuits. A first via layer is disposed on a surface of the sensing layer, with the first via layer being an elastomer having channels for the operation of fluid-based interconnects that are fluidically coupled to one or more fluid-based circuits of the sensing layer. This layer may also contain electrically conductive vias. Additionally, a gate layer is disposed on a surface of the first via layer, with the gate layer being an elastomer having channels for the operation of fluid-based gate and routing circuits that are fluidically coupled to one or more fluid-based circuits of the first via layer. Also, a second via layer is disposed on a surface of the gate layer, with the second via layer being an elastomer having channels for the operation of fluid-based interconnects that are fluidically coupled to one or more fluid-based circuits of the gate layer. On the second via layer, a source and drain layer is disposed, with the source and drain layer being an elastomer having channels for the operation of fluid-based source and drain circuits that are fluidically coupled to one or more fluid-based circuits of the second via layer.

Furthermore, a third via layer is disposed on a surface of the gate layer, with the third via layer being an elastomer having channels for the operation of fluid-based interconnects that are fluidically coupled to one or more fluid-based circuits of the source and drain layer. Finally, an actuator layer is disposed on a surface of the gate layer, with the actuator layer being an elastomer having channels for the operation of fluid-based actuators that are fluidically coupled to one or more fluid-based circuits of the third via layer.

Thus, embodiments of the disclosure comprise LSI design rules, and manufacturing processes to create devices, such as a fluidic circuit stack for control, sensing, and actuation, in applications for virtual reality, augmented reality, and mixed reality (VR, AR, and MR).

BRIEF DESCRIPTION OF THE FIGURES

FIG. 5A illustrates an exemplary set of fluidic actuators and a fluidic inverter used in a fluidic circuit stack, according to one embodiment.

Figure 1:
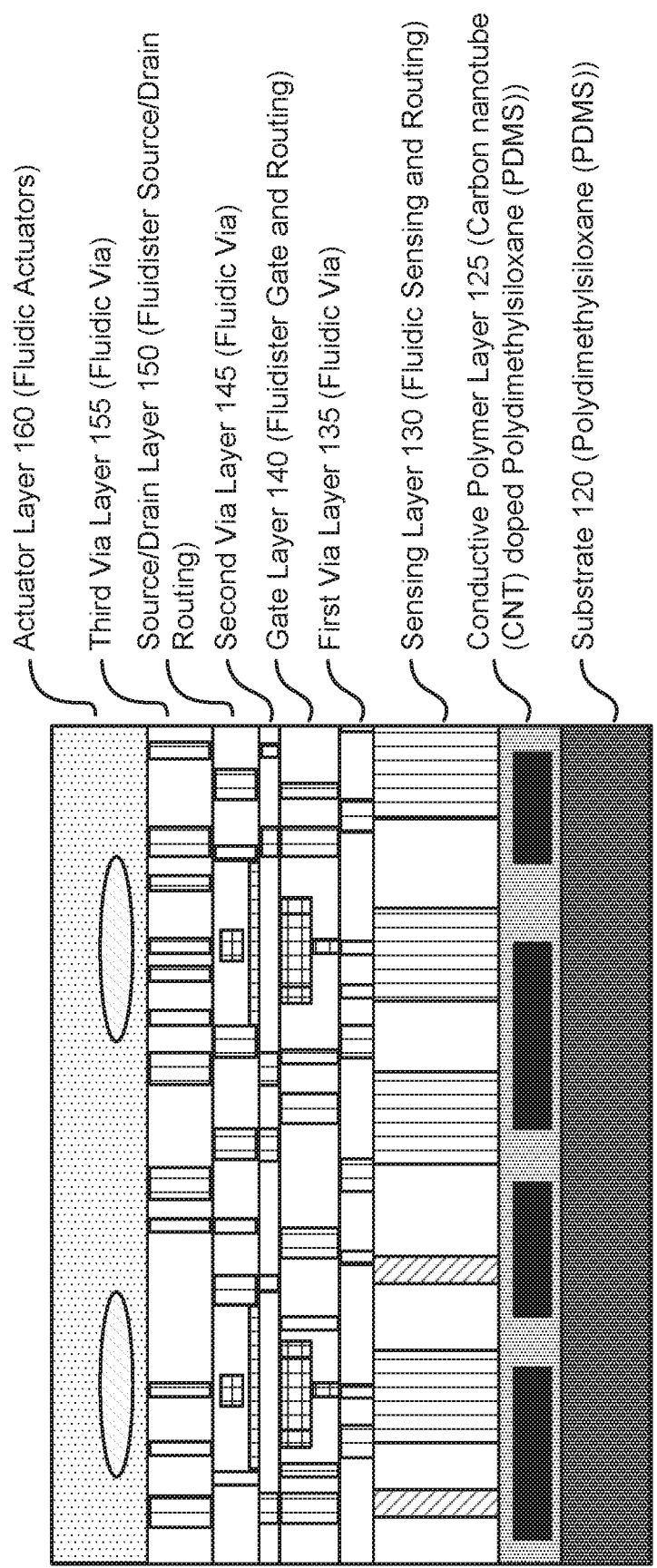
FIG. 1 is an example diagram of a cross-section of a fluidic circuit stack, in accordance with an embodiment.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Overview

Embodiments include the large scale integration of haptic devices, which may be used in a VR system, such as a pure virtual reality (VR) system, an augmented reality (AR) system, a mixed reality (MR) system, or some combination thereof. These haptic devices may be fluidic, or they may be electrical, magnetic, etc. Fluidic devices are fluid handling devices that function similarly to electronic devices (e.g., an electrical transistor, an electrical diode, etc.). For example, a fluidic device may be designed such that it operates as a fluidic transistor, i.e., a transistor that handles a fluid instead of electrical impulses. The combination of various coupled fluidic devices, which forms a fluidic circuit, may act as controllers, sensors, and actuators in a haptic device, such as a haptic glove, in a VR system. For example, a combination of fluidic devices may limit or augment a user's movement in response to a virtual input in the VR system. This may happen, for example, when a user interacts with a solid virtual object in the VR environment which would in reality restrict the movement of the user's body, such as his or her hand. The haptic device coupled to the VR system may use the combination of fluidic devices to restrict the movement of the user's body to simulate this restriction of movement. These fluidic devices can also be coupled to non-fluidic devices (for example, electrical and electronic devices), such as sensors, controllers and actuators, to form a combined fluidic and non-fluidic haptic devices, such as a haptic glove, in a VR system.

Independently assembling and driving each actuator or sensor element, however, may be too large or cumbersome to assemble into a full haptic system. This may cause an issue where a combination of haptic device elements; e.g, sensors, actuators, control, and power distribution devices, may not be physically compact enough to be situated on a haptic system. Alternatively, or as another issue, the combination of haptic system elements may have a large weight, or be complex to implement in a small area. Additionally, the implementation of a haptic system by combining individual haptic device elements may not be easily scalable. The combination and integration of individual fluidic devices may also be unreliable or less reliable than by a systematic means of integration. To resolve this issue, the fluidic circuits may instead be stacked layer by layer in a form of large scale integration (LSI).

By utilizing LSI, the fluidic and non-fluidic circuits may be layered using various methods, and the resulting circuit is more compact in size and better satisfies the dimensional, weight, or other requirements of a haptic device. The stacking of components may also reduce manufacturing costs by compacting the fluidic and non-fluidic circuits into a smaller area. The miniaturization of the fluidic circuit via LSI may also reduce fluid pumping requirements, reducing the size of any fluidic pumps, channels, and so on. It may also reduce the potential of fluid leakage in the circuit, as the pressure of the fluid channels may be reduced. It may also reduce the noise impact of the fluidic circuit, as the smaller channels may create smaller turbulences, if any, resulting in quieter operation. The LSI of these fluidic circuits allows for more complicated fluidic circuits to be attached to a haptic or other VR device to perform various desired operations.

The large scale integration of fluidic and other circuits (e.g., electronic, electromechanical, etc.) allows for multiple advantages over traditional designs. LSI includes various design rules, manufacturing processes constraints, and other conditions that enable integration of various components together in a system that functions to achieve particular goals, such as optimization of components in a compact space to provide physical forces for a VR/AR/MR environment, e.g., in a haptic glove application. Although description is made below regarding a particular implementation of a fluidic circuit stack, the invention is not limited to such a stack and instead also comprises these design rules, manufacturing constraints, and other conditions to create an ecosystem where such products as the fluidic circuit stack described herein may be created. Additional details regarding the LSI of fluidic circuits are described below.

Exemplary Design Rules for Large Scale Integration

As noted above, the large scale integration (LSI) of fluid and non-fluid circuits may comply with various design rules in order to generate various circuits and components that meet the goals of the LSI, as described above. An exemplary set of design rules is presented here. However, these design goals should not be construed as limiting, and in other embodiments, the LSI may include more, less, and/or different design rules.

Example design rules may relate to 1) feature size, 2) operating pressures/voltages, 3) layer dimensions, 4) propagation delay requirements, 5) thermal design requirements, and 6) additional global constraints. In some embodiments, alternate and/or additional design rules may be part of a LSI process.

The feature size of the components may be constrained in order to achieve a certain level of compactness and to facilitate the compliance with other requirements in the system, such as operating pressures, thermal design requirements, and so on. For example, a maximum pitch requirement of fluidic channels (or other connections) may be implemented in the LSI design to minimize component size and allow for the operating pressure requirements to be reached without, for example, a large pump. In one embodiment, the design rules specify both a minimum pitch and a maximum pitch (e.g., 1 mm-5 mm). The feature size requirements may also apply to other components, such as maximum component size (e.g., 1 cm), maximum internal fluid volume of a component (e.g., 1 ml), and so on.

The operating pressures and voltages of an LSI designed component or system may be constrained by the design rules. This may facilitate the efficient delivery of power to different components of the system in coordination with the other design rules to achieve the goals of the LSI as described above. In one embodiment, the design rules may specify a minimum and maximum fluid pressure value. The minimum pressure may be −1 bar (e.g., a vacuum at zero absolute pressure). The maximum pressure may be 3 bars. For example, a high pressure line in an LSI design could be 1 bar (atmospheric pressure), while the low pressure line may be −1 bar (a vacuum). In one embodiment, the design rules may specify a minimum and maximum voltage or multiple operating voltages. For example, the voltage of certain components could be set to a lower voltage, such as 3.3 volts. The voltage of other components may be set at a high voltage, such as 312 volts. Design rules may specify how voltage carrying components interact with fluid carrying components such that no leakage of electrical current into the fluid occurs.

Certain layer dimensions and characteristics may be specified by the design rules to achieve the goals of the LSI. Different layers including different components may have different maximum and/or minimum thicknesses to account for the dimensions of the components in the layer as well as the overall dimensions of the system (e.g., the circuit stack), structural integrity, manufacturing requirements, and so on. For example, a fluidic via layer may be of a particular thickness (e.g., 5 mm), in consideration of the diameter of the fluidic vias in the layer. The vias themselves may have specific dimensional requirements, such a required thickness (e.g., 1 mm), and with a minimum surrounding spacing, e.g., of 2 mm. The layers themselves may also be constrained by hardness requirements, such as a specific durometer (e.g., 10-50 Shore durometer hardness). The layers may also have elongation tear resistance requirements, such as an elongation to tear greater than 200%. The layers may be selected such that they may cure below a certain temperature (e.g., 140 centigrade), so that other components in the system are not affected by high temperatures. Design rules may also specify that the layers be resistant to certain wavelengths of EM radiation (e.g., UV radiation) used for curing. Thus, the design rules may specify a minimum percentage structural integrity after exposure of a minimum time to a curing electromagnetic (EM) radiation of a set frequency range and intensity range The propagation delay of the system may be specified by the design rules. The propagation delay is the time measured for a signal to travel a certain distance in the system. In particular, here the propagation delay is defined as the end to end delay on a VR/AR/MR component, such as a haptic glove. A fluid or other signal emanating from one end or boundary of the component (e.g., the glove base) should reach the other/opposite end or boundary (e.g., a finger) within a maximum propagation delay value, such as 30 ms. The propagation delay design rule influences multiple secondary rules and characteristics regarding the components selected, materials selected, and so on, in order for the propagation delay to be maintained. For example, the design rules may specify the use of gain components at certain intervals along a circuit to accelerate the flow of fluids in the circuit to reduce the propagation delay. Actuators and other components may be specified to have maximum capacitances (fluid volume capacity) in order to decrease their response time. This may require the actuators to be designed to act with lower fluid capacity than in traditional cases.

Thermal constraints may be specified by the design rules. The thermal constraints are designed such that the system does not generate excessive temperatures that could affect components on the system or, more significantly, the user. For example, if the system were a haptic glove, excessive thermal radiation from the haptic glove would be conducted to the user's hand, causing an uncomfortable and potentially dangerous situation. Thus, heat flux per skin contact area may be limited (e.g., to 40 mw/cm$^2$ epidermal contact area). To achieve these design rules, components may be designed such that thermal radiation may be redirected towards a portion of the system that does not contact the user's skin, e.g., via the use of radiators. Note that heat may be generated due to mechanical friction in mechanical pumps and actuators, as well as with electrical components. Examples of a fluidic circuit stack and other components adhering to these design rules for LSI are described below with reference to FIG. 1-6.

Exemplary Manufacturing Processes for Large Scale Integration

In accordance with the design rules described above, an LSI system or component may be manufactured according to certain processes. These may include various printing processes, casting processes, bonding processes, various agents used, and/or various testing procedures, as well as overall manufacturing processes, such as the use of roll-to-roll processing. These manufacturing process constraints should not be construed as limiting, and in other embodiments, the LSI may use different manufacturing processes.

Various processes may be used during manufacture of the LSI system. Various printing techniques, such as stencil printing, and screen printing, may be used to lay the components and other elements in the LSI system (e.g., a fluidic circuit stack). Various casting processes, such as lost wax casting may be used, whereby polymer materials such as silicone are cast around a wax mold, and the wax mold is later removed.

Different layer bonding techniques, such as gluing and calendaring (using a calendar machine) may be used, in coordination with techniques such as pin based alignment, plasma treatment, silicone glue, glue masking, removal of glue (e.g., using squeegee techniques), cure inhibiting agents (e.g., to prevent clogging of fluid channels), cure accelerating agents, and so on, to form the layers and components of the LSI system. This may be combined with roll-to-roll manufacturing to create an efficient mass production process for the LSI system.

The manufacturing process may also specify various verification and testing steps, such as a conductance test, whereby a live electrical connection is tested between a fluid channel and an electrical channel. Such a live connection may be undesirable, and a positive result may require discarding of the component.

The manufacturing facility itself may be controlled for environmental factors, such as humidity, temperature control, and air quality. The environmental factors may be set such that the failure rate of manufactured LSI systems is reduced. Production speeds may be limited by the curing speed of the components, and selection of molds may also be constrained (e.g., the material of the molds may be selected to be compatible with the components). An example of a manufacturing process is described below with regards to FIGS. 7-8.

Exemplary Layered Fluidic Circuit

FIG. 1 is an example diagram of a cross-section of a fluidic circuit stack 110, in accordance with an embodiment. The fluidic circuit stack may be designed according to the design rules described above. Although the fluidic circuit stack 110 in FIG. 1 illustrates a particular order of layers and organization of components, in other embodiments the components may be layered in a different fashion or may be organized differently within each layer. For example, the sensor layer may be placed above the actuator layer. As another example, different layers described below may reside on the same physical layer (e.g., be at a single elevation). As noted above, the fluidic circuit stack 110 is one example of a system of components that may be achieved using the various design rules and manufacturing processes for LSI. These design rules and processes will be describe in further detail below.

The layers of the fluidic circuit stack 110 include a plurality of fluidic circuits and electronic circuits. A fluidic circuit is analogous to an electrical circuit, but instead replaces electrical current with fluid flow, electric potential with fluid pressure, and electrical conductors with fluid-bearing channels (e.g., a tube). The fluid may be a non-compressible liquid, or may be a gas, or a combination thereof. A fluidic circuit may present various advantages for use in a haptic device. For example, instead of requiring a separate higher current source and electrical motor to operate a mechanical actuator, the fluidic circuit may be able to operate a fluidic actuator using the same fluidic circuit of the control or other sensing mechanisms in the fluidic circuit. However, the physical size of the fluidic circuits compared to the corresponding electronic circuits may pose an issue, as the size of certain haptic devices may not easily accommodate the size of these fluidic circuits. To resolve this issue, the fluidic circuits may be stacked together using large scale integration (LSI).

An exemplary illustration of such a stacked fluidic circuit 110 with multiple layers is illustrated in FIG. 1, with additional details regarding the fluidic circuit stack 110 and individual circuits described below with reference to FIGS. 1-7, as well an exemplary method of layering the fluidic circuit stack described with reference to FIGS. 8-9.

Following from the bottom of the fluidic circuit stack 110 to the top, the first layer is the substrate 120, which may be composed of polymer. This polymer may have certain desirable properties, such as being hydrophobic, flexible up to at least a threshold bending value without structural failure, durable up to a specified lifetime, non-flammable, and so on. In one embodiment, the polymer of the substrate 120 is polydimethylsiloxane (PDMS). One benefit of PDMS is that it does not adsorb liquids, although depending on the surface treatment, it can be designed to be wettable or be hydrophobic depending on the application for the fluidic circuit. Additionally, PDMS is non-toxic, biocompatible, flexible, low-cost, stable over a large range of temperatures, non-conductive, transparent, and so on. This makes PDMS a suitable candidate for the material of a substrate 120 for a VR device that may be used on or near a human body.

In other embodiments, the substrate may be made of other material, such as fabric cloth (e.g., with synthetic and/or natural fibers), un-doped polymers, and other large molecules (e.g., those with long chains, such as proteins).

A conductive polymer layer 125 may be formed above the substrate 120 and may allow the formation of electrically conductive circuits within the fluidic circuit stack 110. The electrical circuitry (represented by the darker regions) may interact with the fluidic circuits in other layers of the fluidic circuit stack 110. Examples of electrical circuits that may be embedded in the conductive polymer layer 125 include transistors, switches, relays, integrated circuits, and so on. These electrical circuits may operate fluidic-electric interfaces that allow the electrical circuits to change an operation in a fluidic circuit. For example, one fluidic-electric interface may change the flow of a fluidic channel based upon the application of an electrical potential across the interface, or may change the wetting properties of a surface in contact with a surface in response to an electrical potential applied to the interface.

As another example of a particular application, a VR device, such a haptic device, may receive an input in the form of an electrical signal. This signal may be converted at a fluidic-electric interface at the conductive polymer layer 125, in order to drive the fluidic circuits of the fluidic circuit stack 110. The result may be a change in the position of a fluidic actuator in the VR device.

In one embodiment, the conductive polymer layer is composed of carbon nanotube (CNT) doped PDMS. This is a PDMS material that is doped with CNT nanoparticles, which causes the CNT doped portions of the PDMS material to become electrically conductive. The benefit of doping the PDMS with CNT nanoparticles instead of a metal component is that using metal in the PDMS material creates a disjoint area where durability issues such as cracking may occur. This does not happen when using CNT doping of the PDMS material.

A sensing layer 130 is formed on top of the conductive polymer layer 125 and may include various fluidic circuits and non-fluid circuits that are involved in sensing and routing. For example, these circuits may be in the sensing layer 130 and may sense a movement in an underlying haptic device. The movement may change the properties of the fluid in the sensing layer 130 (e.g., a change in fluid pressure). This may cause the fluidic circuits in the sensing layer 130 to generate a response which may be sent to other layers of the fluidic circuit stack 110. The sensing layer 130 may also include fluidic circuits that perform various routing features, such as routing inputs from the conductive polymer layer 125 to the correct fluidic circuits in other parts of the fluidic circuit stack 110 depending upon the logic in the sensing layer 130. The sensing layer may also include non-fluidic circuits, such as doped polymers that are sensitive to elongation, and generate a change in electrical potential in response to being stretched.

In one embodiment, the sensing layer 130 is made of a similar material to the substrate 120, such as a material that is impermeable to liquid and which can be molded and formed with fluid-bearing channels in order to create fluidic circuits thereupon.

A first via layer 135 is formed on top of the sensing layer 130 and provides interconnection between the circuits of adjacent layers. The via layer, such as the first via layer 135, itself may be an "insulating" layer, or in the case of a fluidic circuit, may provide a barrier to fluid movement between adjacent layers, allowing the fluidic circuits in adjacent layers to function without having fluid leak between circuits in different layers. The via layers may have different thicknesses depending upon the requirements of the adjacent fluidic circuit layers. A via layer may be thinner than a standard thickness due to fluid pressure requirements limiting the thickness. A via layer may be thicker than the standard thickness in order to accommodate higher pressure fluid flow buildups, e.g., when driving actuators.

As illustrated, the first via layer 135 interconnects the sensing layer 130 and the gate layer 140. In one embodiment, the first via layer 135, and the other via layers in the fluidic circuit stack 110, are composed of a similar polymer material to the substrate 120 and the sensing layer 130. However, the via layers may also include fabric material. These fabric materials, in contrast to polymer materials, are created by weaving or composing fibrous strands of material together, and thus resist certain mechanical stresses, such as tension, in comparison to the polymer material, and thus may provide important structural support and reinforcement to the fluid circuit stack 110. Note that although a layer is shown here for the vias, in one embodiment the fluidic circuit stack 110 does not include a via layer. Instead, layers are directly connected to each other, and fluid travels directly from one layer to another without the use of a via layer. For example, one layer may have a cavity within it that aligns with a cavity of an adjacent layer. Once assembled, fluid in the cavity of the one layer may travel freely to the cavity of the other layer, thus forming a direct via.

A gate layer 140 may be formed on top of the first via layer 135 and may include one or more gates for one or more fluidisters (i.e., fluid-based transistors). These fluidisters perform similarly to electrical transistors, and may have a source, drain, and gate, but using fluid instead of electrons. The fluidisters may implement the logic of the fluidic circuit stack, and may react to the output from the sensing layer 130 or other layers in the fluidic circuit stack 110, generating an output that is sent to the other layers of the fluidic circuit stack 110, e.g., the actuator layer 160. An example of a fluidister is described below with reference to FIG. 6.

In one embodiment, the gate layer 140 is composed of the same or similar material to the sensing layer 130, e.g., a polymer that is impermeable to fluids with one or more fluid-bearing channels forming a circuit.

A second via layer 145 is formed on top of the gate layer 140 to provide for interconnection between adjacent layers. The second via layer 145 performs similar functions to the first via layer 135, but may be of a lesser relative thickness compared to the first via layer 135 because it controls the fluidister gate to source and drain separation. The thinner layer may help to reduce fluid pressure losses and other inefficiencies.

The source/drain layer 150 is formed on top of the second via layer 145 and includes fluidic circuits for the source and drain of corresponding gate circuits in the gate layer 140. Thus, a gate circuit in the gate layer 140 may be interconnected to a source and drain circuit in the source/drain layer 150 via the second via layer 145. As noted above, the fluidisters that are composed of a gate, source, and drain, may perform various logic operations in the fluid circuit stack 110, such as determining when to drive the actuators in the fluidic circuit stack 110. As an example, a fluidister may determine (i.e., switch based upon) whether an actuator should be activated based on the input received from the sensing layer 130, which in turn, may have received a signal from an electrical circuit in the conductive polymer layer 125. In response to the input, the fluidister (or multiple fluidisters) transmits a fluidic signal (e.g., cause a fluidic flow) to one or more actuators in an actuator layer to activate the one or more actuators. In one embodiment, the source/drain layer 150 is composed of the same or similar material as the gate layer 140.

A third via layer 155 is formed on top of the source/drain layer 150. In comparison to the first via layer 135 and the second via layer 145, the third via layer 155 may have an increased thickness to accommodate for the higher pressure fluid flows or fluid pressure buildup used to drive the actuators of the actuator layer 160. The thickness may be set such that the higher pressure fluid flow does not cause a premature failure of the via layer before a set lifespan (e.g., mean time before failure remains the same for the third via layer 155 compared to the other via layers and is within specification). The third via layer 155 may receive input from the source/drain layer 150 and interconnect this input to output directed at the actuator layer 160.

An actuator layer 160 is formed on top of the third via layer 155 and includes fluidic and/or non-fluidic actuators (e.g., which are represented as oval shapes in the figure). These fluidic actuators may pump fluid into or out of inflatable bladders, fluid channels, or other variously shaped fluid-containing vessels (not shown) in order to achieve a physical movement or physical movement restriction. The actuators may be activated by the input from the third via layer 155, and may receive a high pressure fluid source from the third via layer 155. For example, an input from the source/drain layer 150 may interconnect via the third via layer 155 to the actuator layer 160 to open a gate allowing fluid from a high pressure fluid source from the third via layer 155 to allow fluid into an actuator in the actuator layer 160, which may in turn direct fluid to inflate a bladder in the haptic device, causing a physical movement restriction in the haptic device. As another example, the actuator may be comprised of multiple layers, with the increase in fluid pressure within an outer layer causing compression upon an inner layer, which causes movement of fluid out of the actuator, and vice versa. In one embodiment, the actuator layer 160 includes non-fluidic actuators. Examples of such non-fluidic actuators include piezoelectric motors.

In one embodiment, the actuator layer 160 is composed of the same or similar material to the source/drain layer 150. The actuator layer 160 may include additional void areas which are used as a larger reservoir to collect fluid. The size of these voids, or the pressure of the fluid within the voids, is adjusted from the input from the other layers of the fluidic circuit stack 110. The voids may be fluidically coupled to the other fluidic circuits in the stack, or may not be. If the voids are not fluidically coupled, the amount of fluid in the void can be changed by a physical pressure placed on the void by surrounding fluidic circuits. In another embodiment, the actuator layer 160 is structured as a matrix (i.e., a mesh) using material such as an elastic polymer (e.g., the polymer material of the substrate 120). The matrix supports one or more of the voids, which may be of the same material as the matrix, or may be a different material that, due to the composition of the material, may only expand in size to a certain limit amount in response to an increase in internal fluidic pressure. As the matrix is not solid, it allows further range of movement of the walls of each void.

By layering the fluidic circuits, for example, in the fluidic circuit stack 110 shown in FIG. 1, an additional complexity in fluidic circuitry may be achieved in a small space, such as on a haptic glove. By combining the sensing, control, and actuation of fluidic circuits into a single layered stack of fluidic circuits, a fully integrated fluidic circuit may be created that may also be portably and easily moved and installed on different haptic devices without significant reconfiguration, creating a "fluidic system on a stack" (i.e., similar to a system on a chip). A user may be able to easily swap out different interoperable fluidic circuit stacks 110 for each other, in the case of repair or upgrading, etc. Furthermore, the fluidic circuit stack 110 described here is easily scalable by the addition of additional components and circuitry, compared to a traditional design. Additional details regarding the layering of fluidic circuit stacks are described below with regard to FIGS. 2-9.

Exemplary Haptic Glove

Figure 2:
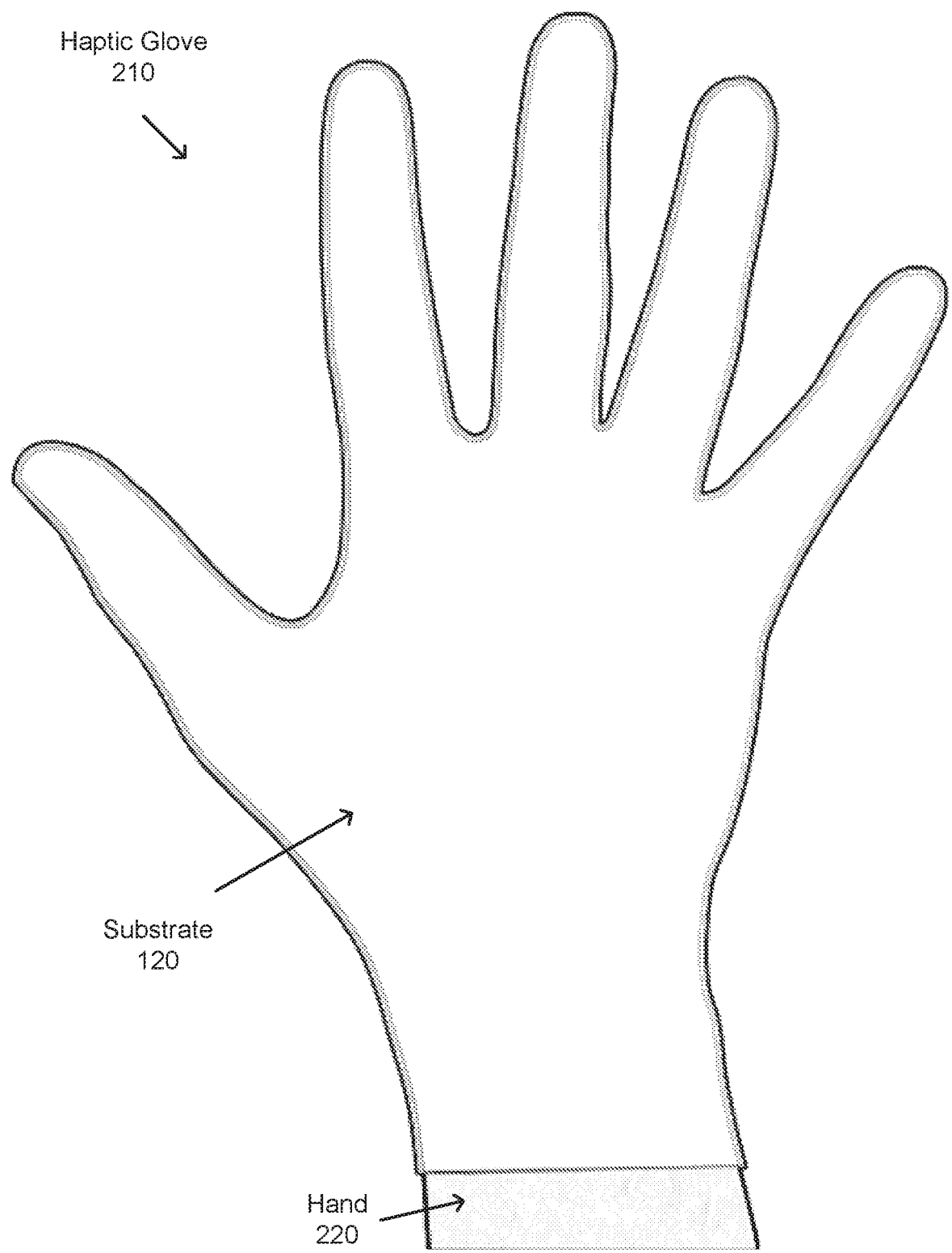
FIG. 2 illustrates a portion of an exemplary haptic device, i.e., a haptic glove, on which the fluidic circuit stack may be formed or placed, according to an embodiment.

FIG. 2 illustrates a portion of an exemplary haptic device, i.e., a haptic glove 210, on which the fluidic circuit stack 110 may be formed or placed, according to an embodiment. The illustration in FIG. 2 shows the haptic glove 210 covering a hand 220. Although the haptic glove 210 may include other fluidic circuits, in the illustration of FIG. 2, only the substrate 120 is shown to illustrate the placement of the substrate 120. The haptic glove 210 may be made solely out of the same material as the substrate 120, e.g., a silicone polymer, or it may be composed of layers of different material, such as natural or synthetic fibers, with the substrate 120 covering the entirety or subsection of the outside of the haptic glove 210. For example, the substrate 120 may only cover the dorsal surface of the hand 220, or wherever the fluidic circuit stack 110 may be placed. Although the fluidic circuit stack 110 is described with reference to a haptic glove 210, in other embodiments the fluidic circuit stack 110 is used with other devices, or as a standalone circuit.

Exemplary Sensing Layer on Haptic Glove

Figure 3:
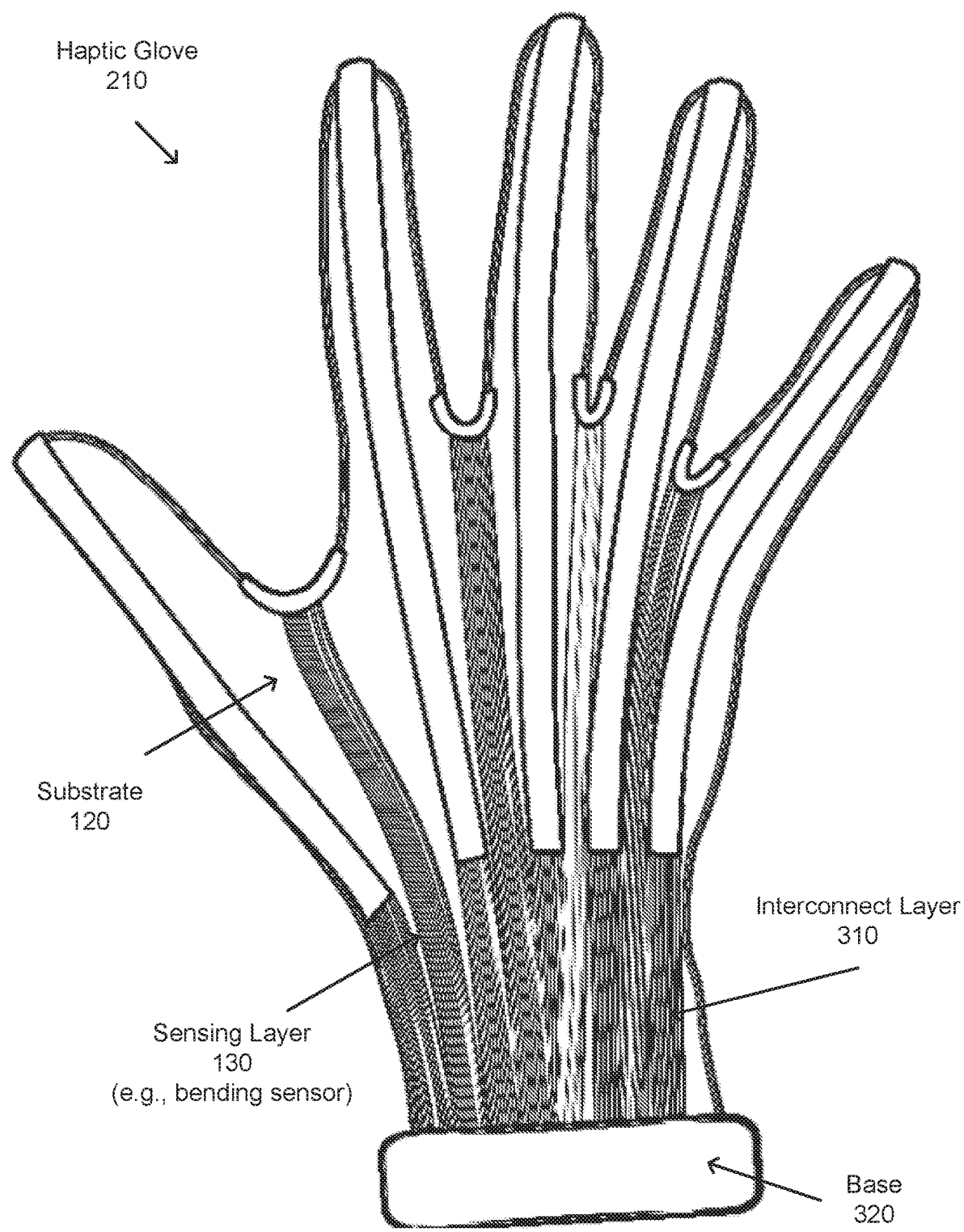
FIG. 3 illustrates a portion of the exemplary haptic glove on which a sensing layer and an interconnect layer has been formed, according to an embodiment.

FIG. 3 illustrates a portion of the exemplary haptic glove 210 on which a sensing layer 130 and an interconnect layer 310 has been formed, according to an embodiment. In the illustration of FIG. 3, an interconnect layer 310 and a sensing layer 130 have been formed on top of the substrate 120. The sensing layer 130 may include one or more sensors, such as a bend sensor that senses a bending movement of the hand in the haptic glove 210 at one or more of the joints of the hand. A bend sensor is a fluidic component that senses the physical bending movement by a change in measured fluid pressure within the bend sensor in response to the bending movement.

The interconnect layer 310 may be a via layer similar to the via layers illustrated in FIG. 1 and may interconnect the components in the sensing layer 130 to other components of the haptic glove 210, such as other components of the sensing layer 130, to other components in other layers (not shown), or to other components at the base 320 of the haptic glove 210. When a fluidic sensor in the sensing layer 130 detects a change or measures a value, it may transmit an output that is passed through the interconnect layer 310 to a destination, such as the gate layer 140.

Exemplary Control and Actuation Layers on Haptic Glove

Figure 4:
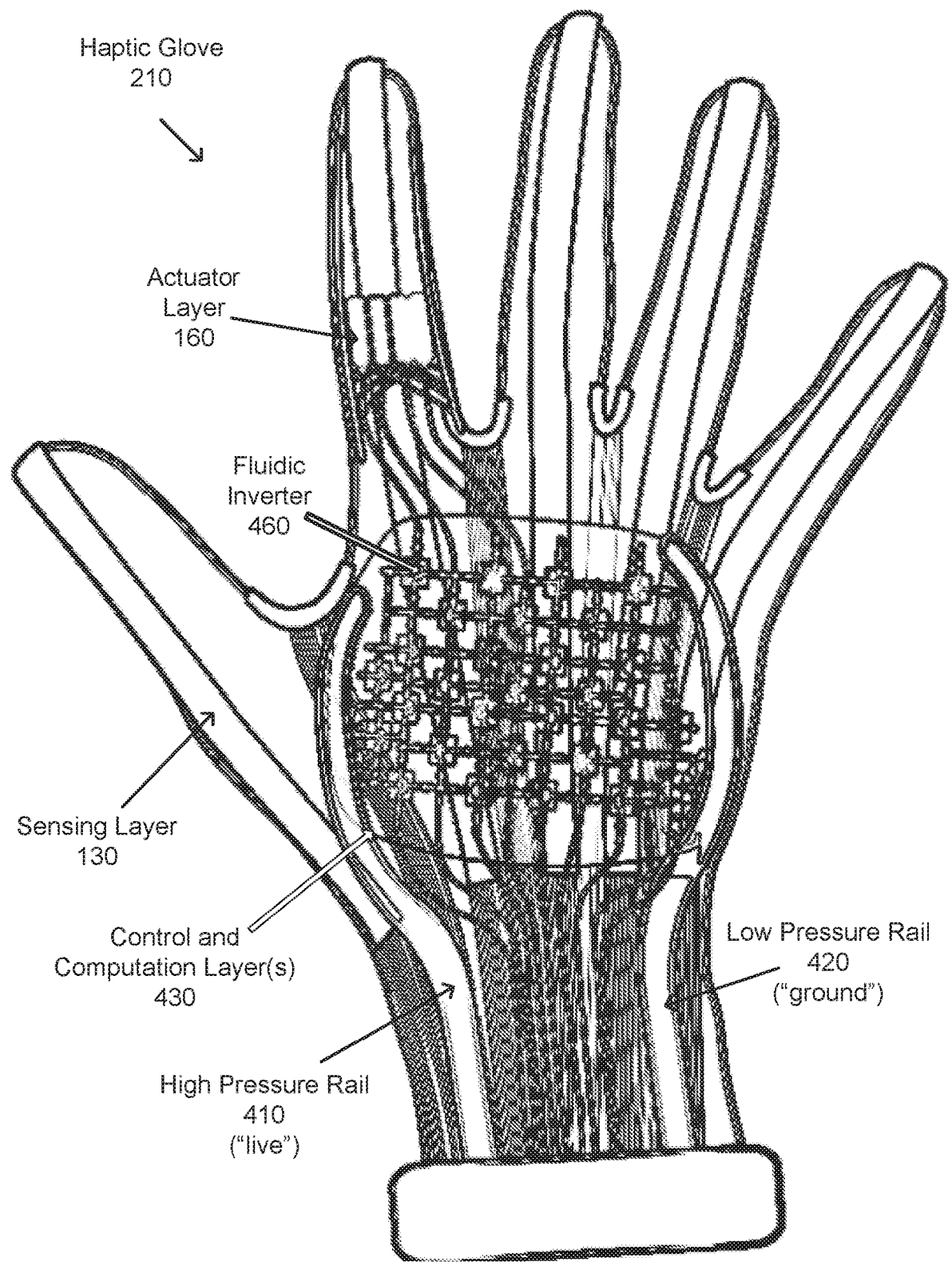
FIG. 4 illustrates a portion of the exemplary haptic glove on which a control and computation layer and actuator layer have been formed, according to an embodiment.

FIG. 4 illustrates a portion of the exemplary haptic glove 210 on which a control and computation layer 430 and actuator layer 160 have been formed, according to an embodiment. The haptic glove 210 additionally includes a high pressure rail 410 and a low pressure rail 420. The illustrated haptic glove 210 in FIG. 4 is merely one example, and in alternative embodiments not shown, the haptic glove 210 may include additional/fewer or different fluidic devices. Likewise, the various entities of the haptic glove 210 may differ in different embodiments.

The high pressure rail 410 is a fluidic component that a fluid at a certain high pressure (e.g., 200 kilopascal/kpa). The structure is made out of a material (e.g., plastic, silicone etc.) that does not deform at this high pressure, however the material may also be flexible. The high pressure rail 410 may have a cross-section that is circular, rectangular, or some other shape, depending on structural or attachment requirements of the haptic glove 210. In one embodiment, the high pressure rail 410 is connected to pressurized fluid source, one or more pumps, or some other device that may be used to ensure the fluid in the high pressure rail 410 maintains the high pressure. The pressure of fluid in the high pressure rail 410 is analogous to a rail voltage for a power source in an electrical system, such that fluid flows away from the high pressure rail 410 toward areas with lower pressure.

The low pressure rail 420 is another structure that transmits fluid. The low pressure rail 120 transmits the fluid at a certain low pressure that is lower than the high pressure of the high pressure rail 410. This low pressure may be at the lowest pressure within the haptic glove 210. The pressure of fluid in the low pressure rail 420 is analogous to an electrical ground in an electrical system. The low pressure of the low pressure rail 420 may be equal to the combined pressure of the fluids as they return from fluidic circuits in the haptic glove 210. The material used in the low pressure rail 420, and its shape, may be the same that is used in the high pressure rail 410. The low pressure rail 420 generally functions as a low pressure zone such that fluid from other parts of the haptic glove 210 coupled to the low pressure rail 420 flows toward the low pressure rail 420. The low pressure rail 420 may be analogous to an electrical ground or neutral line.

The actuator layer 160 includes one or more actuators and may be connected to other layers in the haptic glove 210 via one or more interconnect via layers. The actuators in the actuator layer 160 may induce or restrict physical movement in the haptic glove 210 by, e.g., changing the level of fluid in one or more bladders attached to the haptic glove. Alternatively, each actuator may directly induce or restrict a physical movement in the haptic glove 210 through the change of various fluid levels in the actuator. Additional details regarding the individual actuators in the actuator layer 160 are described with reference to FIG. 5.

In one embodiment, the actuators may elicit vibrotactile feedback, by way of oscillator elements and/or circuits. The actuators may deform the skin in various ways; e.g., normal deformation, shearing deformation, etc. These actuators are fluidic (gas or liquid) powered soft actuators with or without some rigid elements. They may be consist of open or foam filled cavities. These actuators may induce various tactile and kinesthetic forces by filling and emptying chambers and cavities with mechanical properties specifically designed to create these forces. One possible example of such an actuator is a PAM (pneumatic artificial muscle).

The fluidic inverter 460 is a fluidic circuit that converts the flow of fluid from one pressure or direction to a different pressure and/or direction. Additional details regarding the fluidic inverter 460 is described is described with reference to FIG. 5.

The control and computation layer 430 may include one or more of the layers described in the fluidic circuit stack 110 that are used for control and computation, such as the gate layer 140 and source/drain layer 150, along with interconnect via layers. These may utilize analog and/or digital components. The control and computation layer 430 may be coupled to the high pressure rail 410 and the low pressure rail 420, and in addition the control and computation layer 430 may be coupled to the sensing layer 130 and the actuator layer 160. The fluid from the high pressure rail 410 may enter the control and computation layer 430 to drive one or more of the fluidic circuits, such as a fluidister, in the control and computation layer 430. The fluidic circuits in the control and computation layer 430 may receive input from the sensing layers 130 or from an electronic circuit layer, such as the conductive polymer layer 125, perform various logic operations based on the input, and direct output to the actuators in the actuator layer 160.

As an example, the control and computation layer 430 may receive an input from the sensing layer 130 indicating a bending of one of the digits of the haptic glove 210 by a user wearing the haptic glove 210. This may cause the control and computation layer 430 to transmit an electronic signal via the electronic circuit layer (e.g., via wireless communication) to a console or other central device. In response, the console may indicate that the movement in the digit should be restricted (e.g., due to the movement of the digit causing the digit to encounter a virtual object). The control and computation layer 430 may receive from the electronic circuit layer a signal indicating that the movement in the digit should be restricted to a certain value. The control and computation layer 430 may then transmit a fluid-based signal (e.g., by opening a fluid gate) to the actuator(s) in the actuator layer 160 for that digit to restrict the movement accordingly.

Exemplary Components Used in the Fluidic Circuit Stack

FIG. 5A illustrates an exemplary set of fluidic actuators 450 and a fluidic inverter 460 used in a fluidic circuit stack 110, according to one embodiment.

The haptic glove may include multiple fluidic actuators 450. Each fluidic actuator 450 may receive fluid from a high pressure rail 530, and may return fluid via a low pressure rail 535. The high pressure rail 530 and the low pressure rail 535 may be coupled to the main high pressure rail 410 and the low pressure rail 420 of the haptic glove 210, respectively, and may be composed of similar material. The high pressure rail 530 may operate at the same pressure as the high pressure rail 410, or may operate a lower pressure relative to the pressure of the high pressure rail 410.

Each fluidic actuator 450 may be coupled to a fluidister gate 525, which may be a fluidister (i.e., a fluid transistor) or a different fluidic circuit that controls the flow of fluid into and out of the fluidic actuator 450. The fluidister gate 525 may control the input from the high pressure rail 530 into the fluidic actuator 450, or control the output exiting the fluidic actuator 450 to the low pressure rail 535.

In one embodiment, the fluidic actuator 450 changes a volume of fluid within the fluidic actuator 450 itself. In another embodiment, the fluidic actuator changes the volume of fluid in a separate inflatable bladder. The change in the volume of fluid may cause a restriction of physical movement or induce a physical movement in the haptic glove 210. For example, the fluidic actuator 450 may be shaped in such a way that the increase in fluid volume in the fluidic actuator 450 causes it to bend in a certain direction and to a certain degree. As another example, the fluidic actuator 450 may cause a separate inflatable bladder to inflate or deflate by controlling the amount of fluid in the inflatable bladder. In another example, the fluidic actuator 450 may increase a volume of fluid in the fluidic actuator 450 such that it becomes rigid and fixed at a certain shape or orientation (possibly with other fluidic actuators 450). This may cause a restriction in physical movement in the haptic glove 210 in a direction that is contrary to the orientation of the rigid fluidic actuator 450.

The fluidic inverter 460 is a fluidic circuit that performs analogous functions to an inverter in an electronic circuit. In one embodiment, the inverter acts as a buffer and a high-gain element. The fluidic inverter 160 is used to reduce the delay of driving (filling and emptying) highly capacitive loads (either logic or actuators).

Figure 5B:
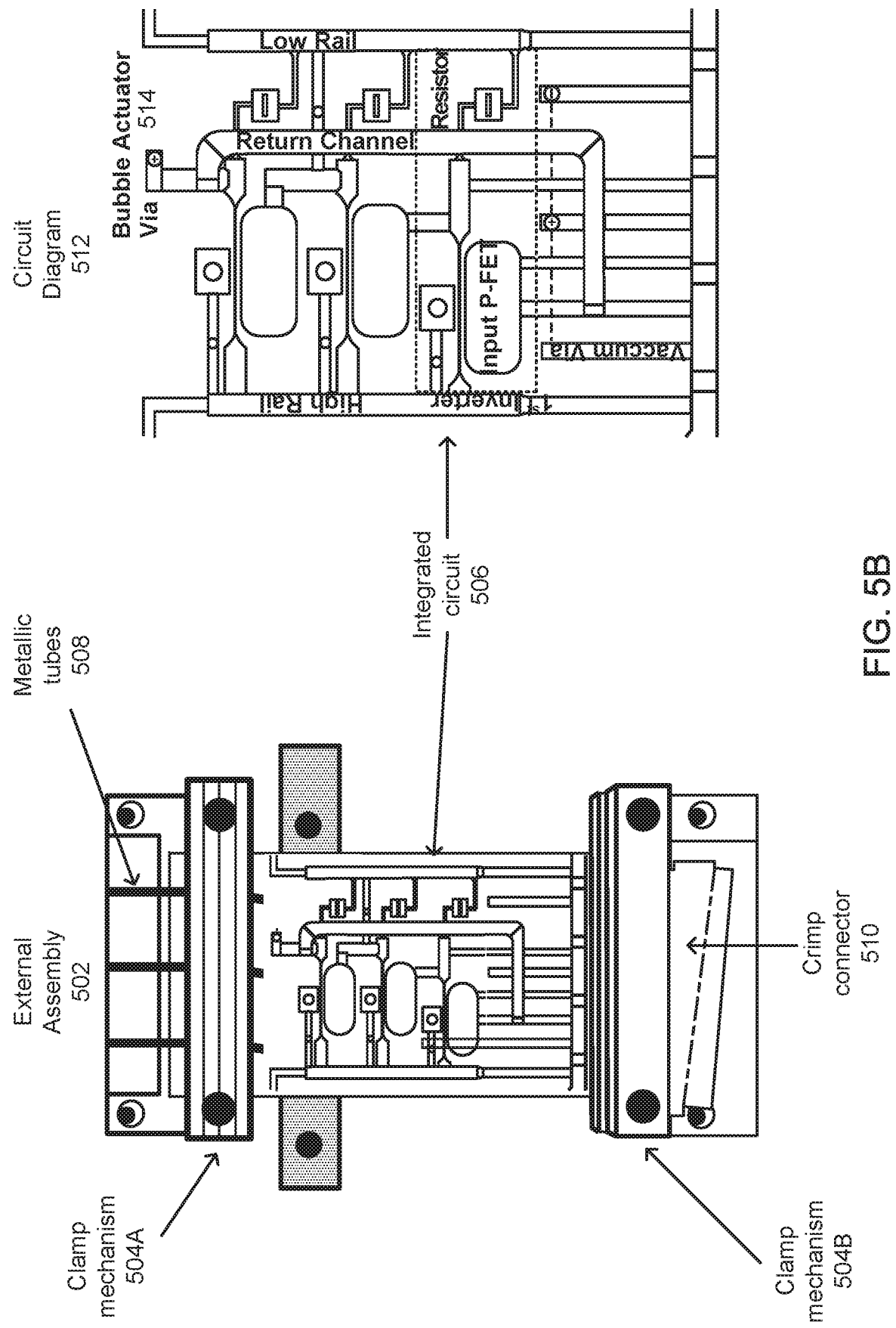
FIG. 5B illustrates an exemplary integrated circuit that includes fluidic and non-fluidic components, according to one embodiment.

FIG. 5B illustrates an exemplary integrated circuit 506 that includes fluidic and non-fluidic components, according to one embodiment.

As shown, the left side of the figure illustrates an external assembly 502. The external assembly 502 includes one or more clamp mechanisms 504. These may be applied to the top and bottom of the integrated circuit 506. The top clamping mechanism 504A mechanically fixes one end of the integrated device and provides fluidic input/output in the form of three metallic tubes 508. The bottom clamping mechanism 504B includes the same mechanical clamping system as well as electrical connectivity via a crimp connector 510.

The right side shows a circuit diagram 512 of the same integrated circuit 506. Here, the integrated circuit 506 includes a chain of inverters that creates an unstable or oscillating behavior which is connected to the "bubble actuator," which is used as an indicator to demonstrate that the oscillator is functioning. This oscillating behavior may be used as a clock signal, to drive additional actuators and/or sensors, or for some other purpose. In the integrated circuit 506, the outlined box indicates a P-FET (fluidic transistor) along with a resistor inverter arrangement. The bubble actuator 514 is a small cavity that can inflate like a balloon when it is exposed to high pressure. Its purpose here is to provide a visible indicator of system performance.

Figure 5C:
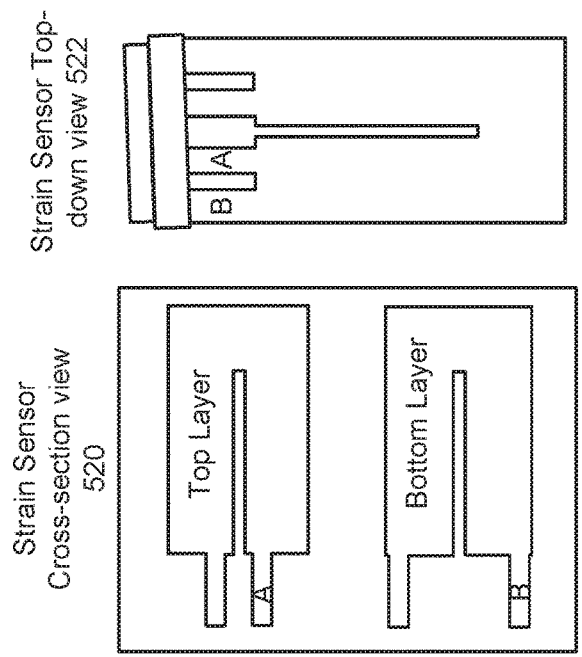
FIG. 5C illustrates an exemplary sensor that may be used in an integrated circuit along with a strain plot for the sensor, according to one embodiment.
Figure 5C:
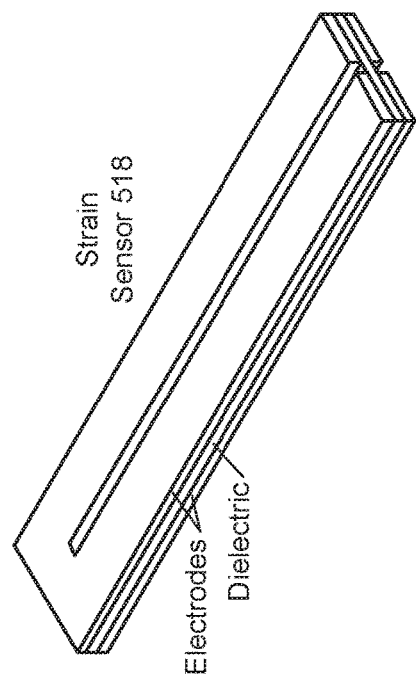
Figure 5C:
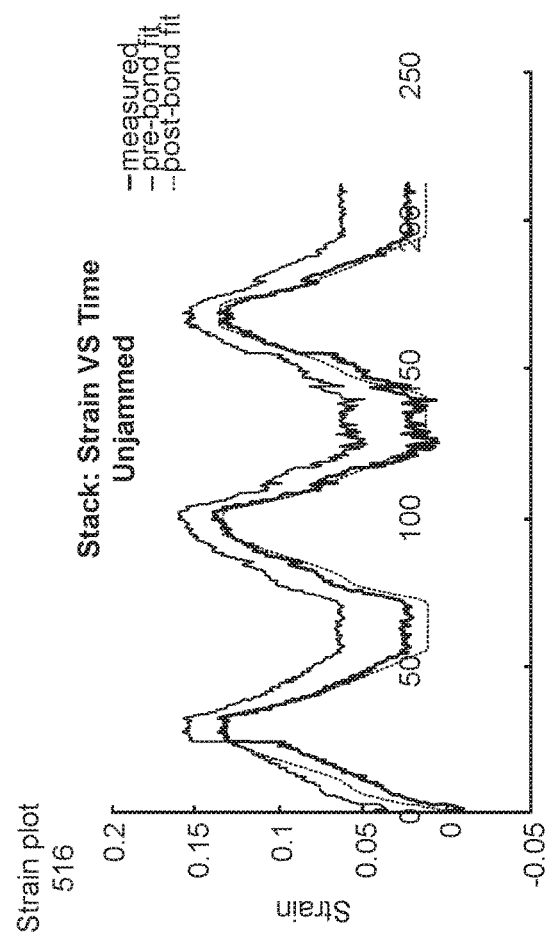

FIG. 5C illustrates an exemplary strain sensor 518 that may be used in an integrated circuit along with a strain plot 516 for the strain sensor 518, according to one embodiment.

The strain sensor 518 outputs a varying electrical signal based on tensile stresses exerted on the strain sensor. The electrical signal from the strain sensor 518 changes in relation to tensile forces due in part due to the cross sectional area of the conduction in the sensor and due to the change in resistivity of the material (due to the piezo-resistive effect). The electrical signal from the sensor could be converted into a fluidic signal by using the changes in electric field between the sensing layers to change the viscosity of an electrorheological fluid and observing these changes in the fluid domain (e.g. flow rate, RC time constant). A cross-section view 520 and a top-down view 522 are also illustrated. Note in the top-down view 522 that the connections to the top and bottom layers of the strain sensor 518 as shown in the cross-section view 520 are coupled to a crimp connector using laterally adjacent rather than stacked connectors.

The strain plot 516 indicates a response of the strain sensor 518 to tensile forces (i.e., stretching) varying over time (e.g., by a testing device). In the "unjammed" state as shown, the haptic device to which the sensor 518 is attached is in a low stiffness state, i.e., has not been "activated." The "measured" value in the strain plot 516 is the value of the strain as determined externally with test equipment. The "pre-bond fit" in the strain plot 516 is the calibrated result of the strain sensor 518 before the part is built into the haptic device. The "post-bond fit" is the new calibrated result after integration into the haptic device. The strain plot 516 shows a DC offset in the performance but not the sensitivity of the strain sensor 518 after installation into the haptic device.

Additional details regarding the strain sensor 518 are described in U.S. application Ser. No. 14/843,067, filed Sep. 2, 2015, which is hereby incorporated by reference in its entirety.

Figure 5D:
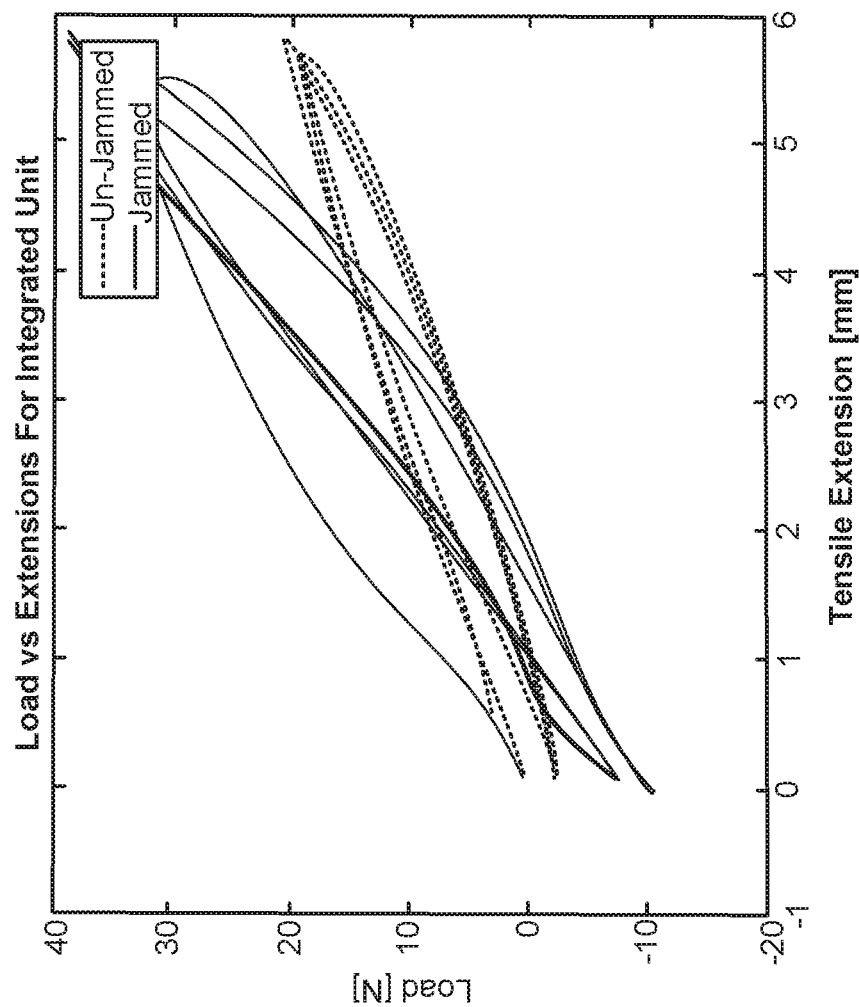
FIG. 5D illustrates a sheet jamming actuator that may be used in a haptic device, according to one embodiment.
Figure 5D:
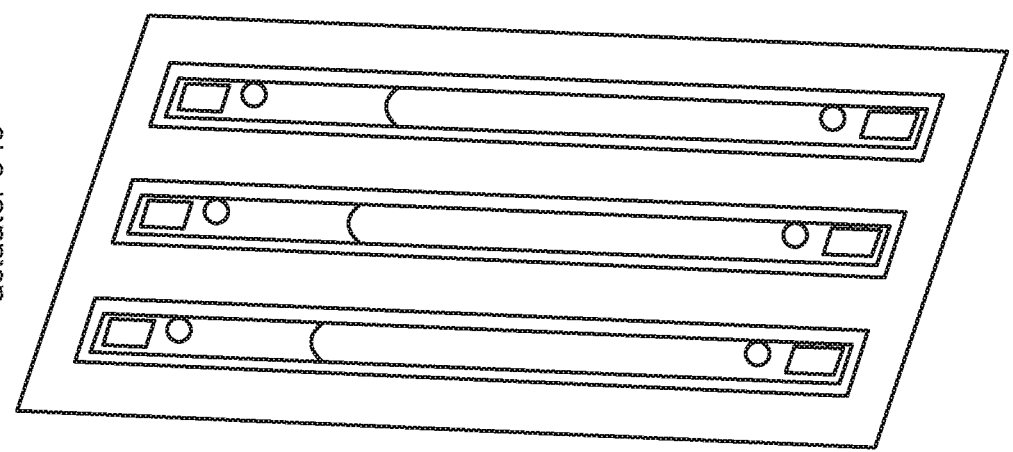

FIG. 5D illustrates a sheet jamming actuator 540 that may be used in a haptic device and an associated strain plot 542, according to one embodiment. The sheet jamming actuator 540 operates by pressing together anchored strips of material, generating sufficient friction to impede motion in a direction parallel to the longitudinal dimension of the strips. Such a device may be used to prevent motion in a haptic device.

The strain plot 542 for the sheet jamming actuator 540 measures the jammed and un-jammed states, as well as the load amount versus the tensile extension of the sheet jamming actuator 540. In the jammed state, the strips in the actuator 540 are pressed together, and in the un-jammed state, the strips are not pressed together (allowing freer motion). Note the lower amount of load necessary to induce the same amount of tensile extension in the jammed state.

Additional details regarding the sheet jamming actuator 540 are described in U.S. application Ser. No. 15/285,391, filed Oct. 4, 2016, U.S. application Ser. No. 15/285,298, filed Oct. 4, 2016, and U.S. application Ser. No. 15/285,281, filed Oct. 4, 2016, all of which are hereby incorporated by reference in their entirety.

Exemplary Fluidic Device Used in the Fluidic Circuit Stack

Figure 6:
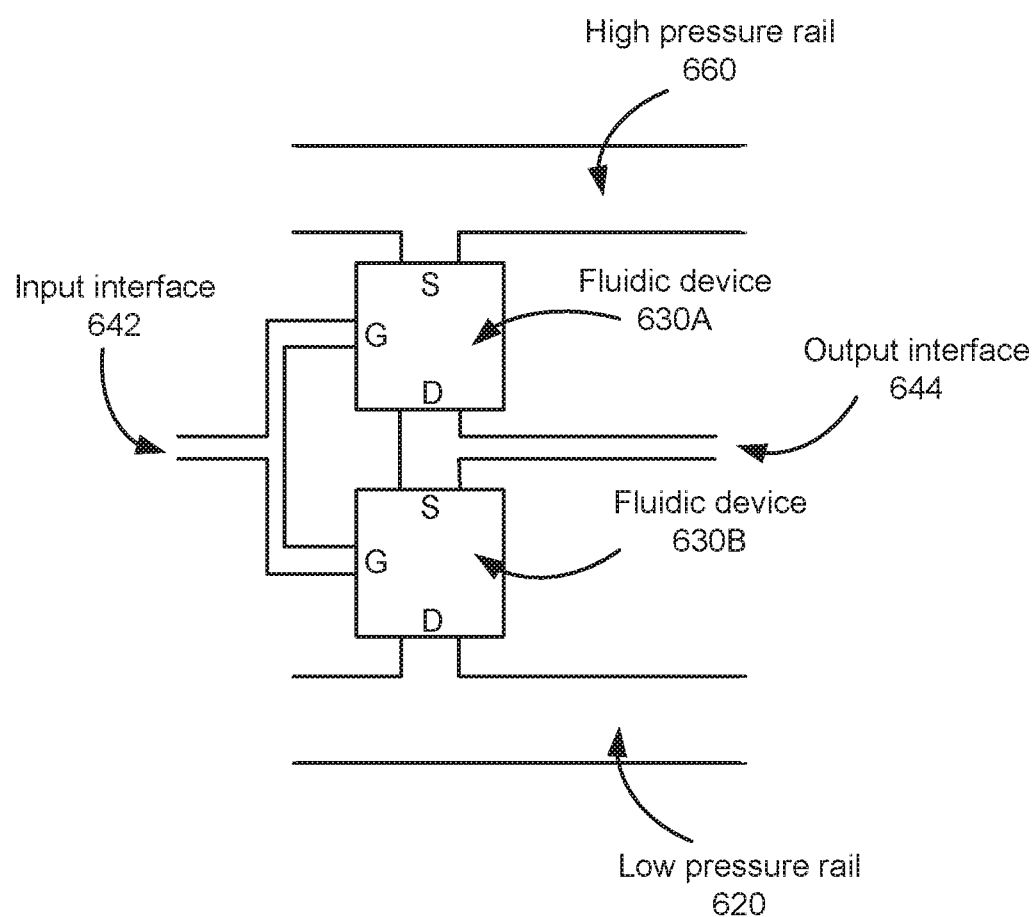
FIG. 6 illustrates an exemplary fluidic device, including fluidic transistors that may be used in a fluidic circuit stack, according to one embodiment.

FIG. 6 illustrates an exemplary fluidic device 600 that includes fluidic transistors which may be used in a fluidic circuit stack 110, according to one embodiment. In one embodiment, the exemplary fluidic device 600 may be used in the control and computation layer 430.

The fluidic devices 630A and 630B are fluidic devices that function analogous to transistors in electrical systems, for example, a P-channel field-effect transistor (PFET), or an N-channel field-effect transistor (NFET). As shown in FIG. 6, each of the fluidic devices 630 includes a source, a drain, and a gate. In some embodiments, there is a channel filled with fluid between the source and the drain, and the pressure of the fluid in the source is higher than the pressure of the fluid in the drain, allowing the flow in the channel to flow from the source to drain when the channel is open. The pressure at the source may be the same pressure as the pressure of the high pressure rail 410, and the pressure at the drain may be the same pressure as the pressure at the low pressure rail 420.

In one embodiment, when the gate is at a low pressure state, the channel is open; and when the gate is at a high pressure state, the channel is closed. In another embodiment, when the gate is at a high pressure state, the channel is in an open state; and when the gate is at a low pressure state, the channel is in a closed state.

An "open" state of the channel refers to a state when the fluid in the channel is flowing from one end (e.g., the source) to the other end (e.g., the drain) at some open threshold rate (e.g., a rate equivalent to the flow rate in the high pressure rail 410). In contrast, a "closed" state of the channel refers to the state when the flow of fluid in the channel is less than some closed threshold rate. In some embodiments, the closed threshold rate may be a zero flow. Alternatively, the closed threshold rate may be some rate of flow that is lower than the open threshold rate. The "open" state of the channel is also referred to as an "ON" condition of a fluidic device, and the "closed" state of the channel is also referred to as an "OFF" condition of a fluidic device. In addition, a "transitionary" state occurs when the channel transitions from an open state to a closed state or from a closed state to an open state. As with an electronic circuit, the time that the channel remains in this transitionary state may vary depending upon the switching speed of the gate, the fluid pressure, and other factors. Additionally, this transitionary state may be minimized using various techniques, such as reducing the channel diameter, increasing the fluid pressure, increasing the speed at which the gate transitions, and so on. Minimizing the time that the channel remains in this transitionary state allows the system to increase the speed at which the fluidic circuit functions.

The high pressure and low pressure described here depends on the fluidic device structures and pressure of the fluid filling the fluidic device. In general, a low pressure is a pressure of the fluid that falls within a low pressure range, and a "high pressure" is a pressure of the fluid that falls within a high pressure range. The low pressure range may be thought of as a digital "0" and the high pressure range may be thought of as a digital "1." Accordingly, the fluidic devices 630A, 630B may operate digitally using the fluid at different pressures. Moreover, different components of a fluidic device may have different high pressure ranges and different low pressure ranges. For example, a high pressure range of a gate may be less than a high pressure range of a source.

The input interface 642 is an interface that enables the fluidic devices 630 to receive inputs. In one embodiment, an input to a fluidic device 630 is fluid at a certain pressure that is applied to certain parts of the fluidic device that can cause the fluidic device to remain or be changed to an "ON" or "OFF" condition. As one example, the input may be fluid at a certain pressure that is applied to the gates of the fluid devices 630, which causes the fluid device to change to an "ON" state. Similarly, the output interface 644 is an interface that enables the fluidic devices 630A, 630B to provide outputs. This output allows the fluid device to drive additional fluid circuits, or to amplify the fluid signal received at the input interface 642, and so on. As used here, amplifying a fluid signal may involve increasing the amount of fluid flow while retaining the same fluid pressure. An increased fluid flow may be needed to drive an actuator, although the fluidic device 630 may not need such an increased flow.

Exemplary Process for Forming a Fluidic Circuit Stack

To form a fluidic circuit stack, such as fluidic circuit stack 110, in one embodiment, the polymer material of the substrate layer 120 is impregnated on or into a fabric material (e.g., any natural or synthetic fiber) of the haptic glove 210. This impregnation may be achieved via adhesion of the polymer to the fabric, chemical deposition, or some other means.

Subsequently, additional layers, such as a conductive polymer layer 125 as shown in FIG. 1, are formed on top of the substrate 120. The conductive polymer layer 125 may include a polymer material that is similar to the polymer material of the substrate 120, but may be CNT-doped using various physical or chemical dispersion methods (e.g., shear mixing of CNT particles into polymer prior to formation of layer). The conductive regions may form electrically conductive channels in the conductive polymer layer 125, or may cause the conductive polymer layer 125 to behave as a semiconductor (e.g., a P-doped semiconductor).

Figure 7:
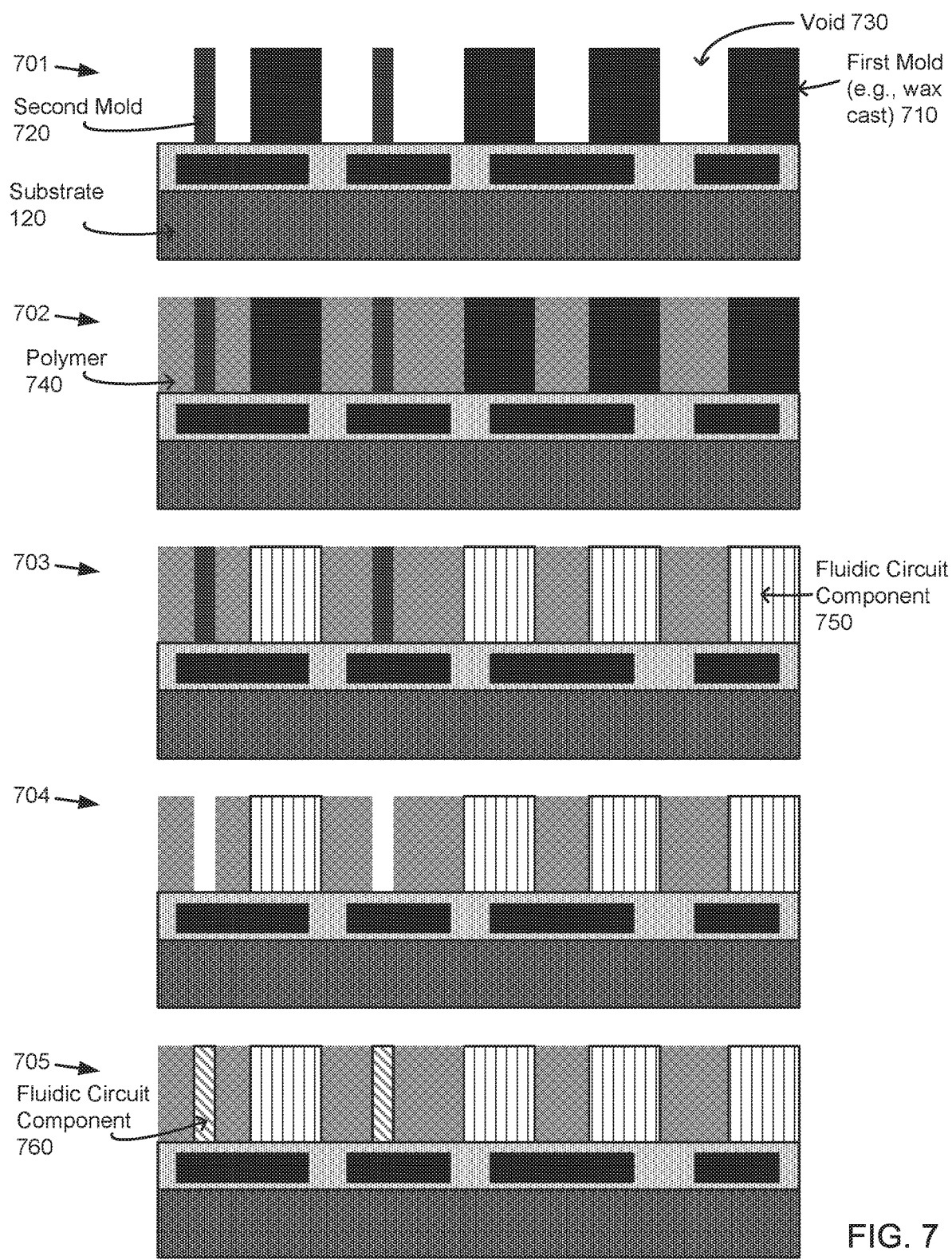
FIG. 7 illustrates an exemplary process for forming the fluidic circuit stack, according to one embodiment.

Alternatively, or subsequently, layers are formed which create the fluidic circuit of the fluidic circuit stack 110. This process is illustrated in FIG. 7. One or more molds, such as the first mold 710 and the second mold 720, may be formed on the current top most layer of the fluidic circuit stack 110 (e.g., the substrate 120 or conductive polymer layer 125). These molds may be made of a material that is to be subsequently removed, such as a wax or other material that may be dissolved, etched, ablated, or otherwise destroyed subsequent to formation of the fluidic circuits (e.g., lost wax casting). Alternatively, the molds may be reused over multiple layerings, and thus may be of a more durable material, such as a metal alloy or a ceramic material, etc. Two different molds may be used if different fluidic circuits are to be laid out on the same layer.

FIG. 7 illustrates an exemplary process for forming the fluidic circuit stack 110, according to one embodiment. Although a certain order of layers and process is shown in FIG. 7, in other embodiments the fluidic circuit stack 110 is formed in a different order and using different methods. Furthermore, the process in FIG. 7 is illustrated using a cross-section for ease of understanding and explanation. However, in actual practice, the fluidic circuit stack 110 is a three dimensional object, and the layers are placed in three dimensions. Furthermore, the fluidic circuits also span three dimensions.

In the exemplary process in FIG. 7, at 701, a first mold 710 and a second mold 720 are placed on the existing layers of a fluidic circuit stack. This creates a layer having sections of the molds and sections of void 730. Subsequently, at 702, the void areas are filled with the polymer material 740 used for the current layer being formed. This polymer material 740 may be rolled on or dispensed onto the molds (e.g., via 3D printing), causing the polymer material 740 to fill the void areas 730. This polymer material 740 may be similar in composition to the substrate 120.

The polymer material 740 may then be cured. This may be achieved by applying heat (e.g., to a curing temperature for a set duration) to the polymer material 740 or causing a chemical reaction in the polymer material 740 (e.g., by using a chemical to fix the polymer chains of the polymer material), or by using light (e.g., UV radiation). Any excess polymer material 740 may be removed from the top of the layer by scraping, laser ablating, or some other process, either before or after curing.

At 703, the first mold 710 may be removed, allowing the fluidic circuit component 750 to be placed in the location where the first mold 710 previously occupied. As noted, the mold may be removed via destruction of the mold or by physical removal of the mold. The fluidic circuit component 750 may directly be formed by the first mold 710, i.e., the mold includes the design of the fluidic circuit component 750, in which case it is not actually placed but is fully formed after removal of the first mold 710 (e.g., the first mold may contain a negative casting of the fluidic circuit). Alternatively, the fluidic circuit component 750 may be a separate structure, and may be placed, for example, using a pick and place machine.

At 704, the second mold 720 may be removed, similar to how the first mold is removed, and at 705, a fluidic circuit component 760 is placed in the location where the second mold 720 had occupied. The placement of the fluidic circuit component 760 may be similar to the placement of the fluidic circuit component 750.

In one embodiment, instead of forming the layer using a molding process as described above, the layers are pre-formed separately and placed on the fluidic circuit stack. The pre-formed layers may have been created using a separate casting process, stamping process, 3D printing process, or other means, which may be faster than the molding process described here in certain circumstances (e.g., for very large scale production of the same circuits).

In one embodiment, instead of the molding process described here, instead, a solid layer is formed using the polymer material 740 and a mask is formed on top of the polymer material. The mask obscures those areas which should be removed. The exposed areas that are not obscured by the mask are cured using a curing process (e.g., curing via laser), and the mask is removed. The remaining areas of polymer material 740, which have not been cured, are removed (e.g., using an acid, wash, etching, or other process), forming the circuits for the layer.

In one embodiment, instead of the molding process described here, a chemical deposition process, similar to the process used to generate the substrate, may be used to form each layer. Seed material may be placed where circuit features are desired, and the polymer material 740 is deposited to form the fluidic circuits of the layer.

Other processes may also be used to form or remove materials from each layer, and may include laser ablation, water jet cutting, physical application using rollers, and so on.

As noted previously, some layers may additionally include fabric or other reinforcement material. This material may be placed on the layer pre-formed, or may be deposited on the layer as individual fibers or sub-components of the reinforcement material. For example, if the reinforcement material is fabric, the fibers of the material may be deposited as a mesh on a layer of the fluidic circuit stack.

The molds and/or the fluidic circuit components may include various alignment features, such as markings, physical protrusions, electrical contacts, or other features, that assist in aligning the just formed fluidic circuit layer with a subsequent fluidic circuit layer that is formed on top of the just formed layer. Additionally, the surface of the just formed layer may be specially treated to promote adhesion of the layer to the subsequently formed layer. This special treatment may include increasing the surface energy of the layer.

Note that unlike the formation of electronic circuits, the formation of the fluidic circuit stack is subject to the unique requirements of fluidic circuits. In particular, the channels in which fluids flow may not be designed to be at right angles (e.g., 90 degrees) (or even more acute angles, as this may not create a smooth flow for fluids. Instead, the placement of channels may be limited to certain minimum curve radii. Other considerations such as minimum feature thickness (e.g., to prevent leakage and structural issues), maximum channel distance (e.g., to reduce friction related efficiency losses), and other factors may be considered in developing the fluidic circuit design.

Exemplary Flow for Forming a Fluidic Circuit Stack

Figure 8:
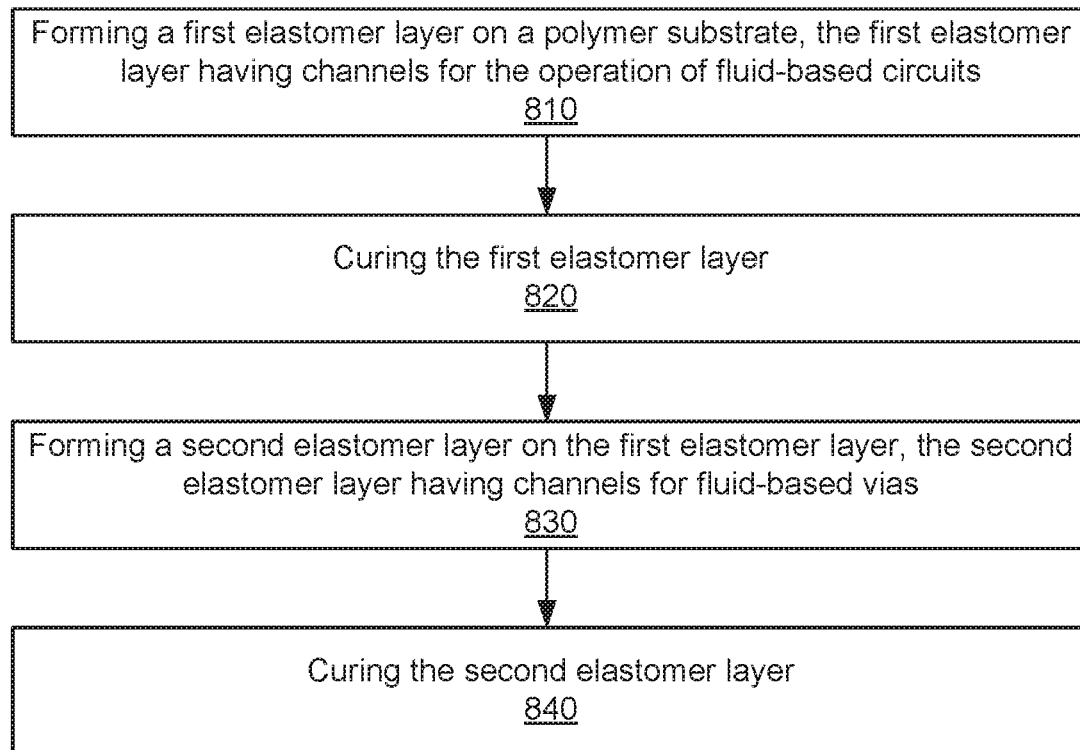
FIG. 8 illustrates and exemplary flow chart for forming a fluidic circuit stack, according to an embodiment.

FIG. 8 illustrates and exemplary flow chart for forming a fluidic circuit stack, according to an embodiment. Although a certain order is shown in FIG. 8, in other embodiments, the order may be different, and additional or fewer operations may be performed. In one embodiment, the process may be performed by an LSI integrator. The LSI integrator is an fabrication device or system of devices which is capable of constructing the fluidic circuit stack. The LSI integrator may include components such as: 1) a clean/low particulate enclosure which may be temperature and humidity controlled, 2) a polymer substrate formation device (e.g., a polymer molding machine), 3) a cleaning device (e.g., to clean the various layers of the device), a mold forming device (e.g., a device that places the mold physically or chemically), 4) a layer forming device (e.g., a device to depose the layer thermally, chemically, physically, or via other methods), 5) a mold removal device (e.g., a device that chemically or physically removes the mold), 6) a layer curing device (e.g., a device that cures a layer thermally, chemically, or via other methods), 7) and/or a pick and place device (e.g., to place components on the fluidic circuit stack). The LSI integrator may be similar to a system of fabrication devices used to form an integrated circuit, but for forming the fluidic circuit stack instead.

The LSI integrator forms 810 a first elastomer layer on a polymer substrate. The first elastomer layer may have channels for the operation of fluid-based circuits. As shown in FIG. 7, the first elastomer layer may be the layer including the polymer 740. The polymer substrate may be the substrate 120.

The LSI integrator cures 820 the first elastomer layer. As described above, the curing process may be completed by various methods, such as heating the layer and/or treating the layer chemically.

The LSI integrator forms 830 a second elastomer layer on the first elastomer layer. The second elastomer layer may have channels for fluid-based vias. For example, the second elastomer layer may be similar to the first via layer 135.

The LSI integrator cures 840 this second elastomer layer. This curing process may be the same as for the first elastomer layer, or may differ due to the thickness, structure, or other characteristics of the second elastomer layer.

In one embodiment, the LSI integrator continues this layering process for the different layers of the stack, such as those layer shown with reference to FIG. 1.

Exemplary VR System

Figure 9:
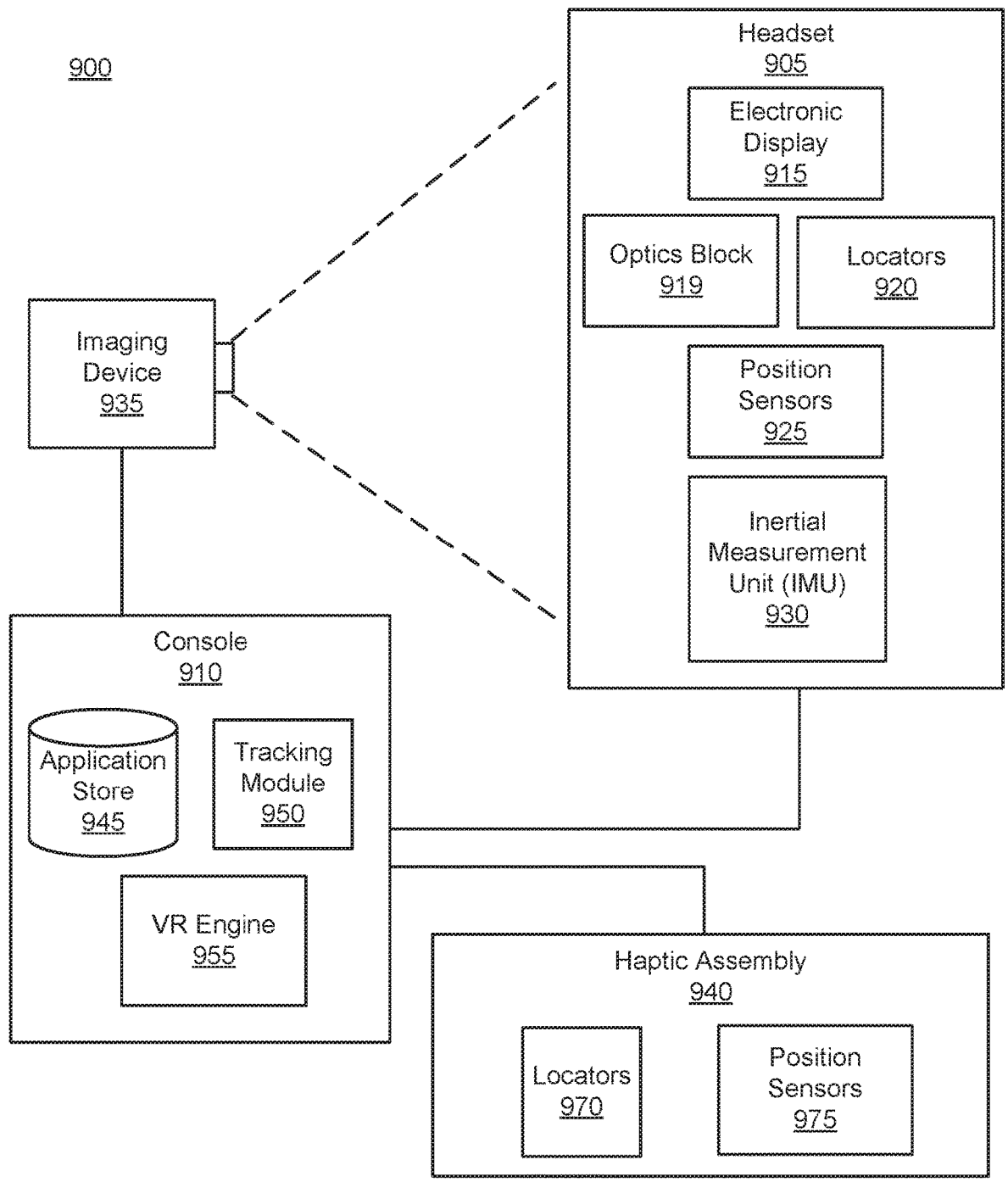
FIG. 9 is a block diagram of a system environment including a virtual reality (VR) system, in accordance with one embodiment.

FIG. 9 is a block diagram of a system 900 including a haptic assembly 940 including at least one fluidic circuit stack, in accordance with one embodiment. The system 900 may operate in a pure VR environment, an AR environment, a MR environment, or some combination thereof. The system 900 shown by FIG. 9 comprises a headset 905, an imaging device 935, and a haptic assembly 940 that are each coupled to a console 910. While FIG. 9 shows an example system 900 including one headset 905, one imaging device 935, and one haptic assembly 940, in other embodiments any number of these components may be included in the system 900. For example, there may be multiple headsets 905 each having an associated haptic assembly 940 and being monitored by one or more imaging devices 935, with each headset 905, haptic assembly 940, and imaging devices 935 communicating with the console 910. In alternative configurations, different and/or additional components may be included in the system environment 900.

The headset 905 is a head-mounted display that presents media to a user. Examples of media presented by the VR head set include one or more images, video, audio, or some combination thereof. In some embodiments, audio is presented via an external device (e.g., speakers and/or headphones) that receives audio information from the headset 905, the console 910, or both, and presents audio data based on the audio information. The headset 905 may comprise one or more rigid bodies, which may be rigidly or non-rigidly coupled to each other together. A rigid coupling between rigid bodies causes the coupled rigid bodies to act as a single rigid entity. In contrast, a non-rigid coupling between rigid bodies allows the rigid bodies to move relative to each other. In some embodiments, the headset 905 may also act as an AR and/or MR headset. In these embodiments, the headset 905 augments views of a physical, real-world environment with computer-generated elements (e.g., images, video, sound, etc.).

The headset 905 includes an electronic display 915, an optics block 918, one or more locators 920, one or more position sensors 925, and an inertial measurement unit (IMU) 930.

The optics block 918 magnifies received light from the electronic display 915, corrects optical errors associated with the image light, and the corrected image light is presented to a user of the headset 905. An optical element may be an aperture, a Fresnel lens, a convex lens, a concave lens, a filter, or any other suitable optical element that affects the image light emitted from the electronic display 915. Moreover, the optics block 918 may include combinations of different optical elements. In some embodiments, one or more of the optical elements in the optics block 918 may have one or more coatings, such as anti-reflective coatings.

The locators 920 are objects located in specific positions on the headset 905 relative to one another and relative to a specific reference point on the headset 905. A locator 920 may be a light emitting diode (LED), a corner cube reflector, a reflective marker, a type of light source that contrasts with an environment in which the headset 905 operates, or some combination thereof. In embodiments where the locators 920 are active (i.e., an LED or other type of light emitting device), the locators 920 may emit light in the visible band (~380 nm to 750 nm), in the infrared (IR) band (~750 nm to 1 mm), in the ultraviolet band (10 nm to 380 nm), some other portion of the electromagnetic spectrum, or some combination thereof.

In some embodiments, the locators 920 are located beneath an outer surface of the headset 905, which is transparent to the wavelengths of light emitted or reflected by the locators 920 or is thin enough to not substantially attenuate the wavelengths of light emitted or reflected by the locators 920. Additionally, in some embodiments, the outer surface or other portions of the headset 905 are opaque in the visible band of wavelengths of light. Thus, the locators 920 may emit light in the IR band under an outer surface that is transparent in the IR band but opaque in the visible band.

The IMU 930 is an electronic device that generates fast calibration data based on measurement signals received from one or more of the position sensors 925. A position sensor 925 generates one or more measurement signals in response to motion of the headset 905. Examples of position sensors 925 include: one or more accelerometers, one or more gyroscopes, one or more magnetometers, another suitable type of sensor that detects motion, a type of sensor used for error correction of the IMU 930, or some combination thereof. The position sensors 925 may be located external to the IMU 930, internal to the IMU 930, or some combination thereof.

Based on the one or more measurement signals from one or more position sensors 925, the IMU 930 generates fast calibration data indicating an estimated position of the headset 905 relative to an initial position of the headset 905. For example, the position sensors 925 include multiple accelerometers to measure translational motion (forward/back, up/down, left/right) and multiple gyroscopes to measure rotational motion (e.g., pitch, yaw, roll). In some embodiments, the IMU 930 rapidly samples the measurement signals and calculates the estimated position of the headset 905 from the sampled data. For example, the IMU 930 integrates the measurement signals received from the accelerometers over time to estimate a velocity vector and integrates the velocity vector over time to determine an estimated position of a reference point on the headset 905. Alternatively, the IMU 930 provides the sampled measurement signals to the console 910, which determines the fast calibration data. The reference point is a point that may be used to describe the position of the headset 905. While the reference point may generally be defined as a point in space; however, in practice the reference point is defined as a point within the headset 905 (e.g., a center of the IMU 930).

The IMU 930 receives one or more calibration parameters from the console 910. As further discussed below, the one or more calibration parameters are used to maintain tracking of the headset 905. Based on a received calibration parameter, the IMU 930 may adjust one or more IMU parameters (e.g., sample rate). In some embodiments, certain calibration parameters cause the IMU 930 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

The imaging device 935 generates slow calibration data in accordance with calibration parameters received from the console 910. Slow calibration data includes one or more images showing observed positions of the locators 920 that are detectable by the imaging device 935. The imaging device 935 may include one or more cameras, one or more video cameras, any other device capable of capturing images including one or more of the locators 920, or some combination thereof. Additionally, the imaging device 935 may include one or more filters (e.g., used to increase signal to noise ratio). The imaging device 935 is designed to detect light emitted or reflected from locators 920 in a field of view of the imaging device 935. In embodiments where the locators 920 include passive elements (e.g., a retroreflector), the imaging device 935 may include a light source that illuminates some or all of the locators 920, which retro-reflect the light towards the light source in the imaging device 935. Slow calibration data is communicated from the imaging device 935 to the console 910, and the imaging device 935 receives one or more calibration parameters from the console 910 to adjust one or more imaging parameters (e.g., focal length, focus, frame rate, ISO, sensor temperature, shutter speed, aperture, etc.).

The haptic assembly 940 is a device that allows a user to send action requests to the console 910. An action request is a request to perform a particular action. For example, an action request may be to start or end an application or to perform a particular action within the application. The haptic assembly 940 also provides haptic feedback including a perception of contacting a virtual object. In one embodiment, the haptic assembly 940 includes a plurality of composable fluidic devices that form one or more composite fluidic devices. The composite fluidic devices may be used to, e.g., address actuators included in the haptic assembly 940 according to the haptic feedback signal from the console 910. In one embodiment, the haptic assembly 940 is a haptic glove 1100 through which the console 910 enables a user to interact with a virtual object. In one embodiment, the haptic device includes a fluidic circuit stack 110, with the composite fluidic devices integrated on the fluidic circuit stack 110.

In FIG. 9, the haptic assembly 940 further includes locators 970, one or more position sensors 975, and an inertial measurement unit (IMU) 980. In some embodiments, the locators 970, one or more position sensors 975, an inertial measurement unit (IMU) 980 are installed to determine a physical position or movement of the haptic assembly 940. In addition, the haptic assembly 940 receives, from the console 910, a haptic feedback signal corresponding to haptic feedback to the user. The haptic assembly 940 provides to the user with the haptic feedback of touching a virtual object in a virtual space, according to the haptic feedback signal. Specifically, the haptic assembly 940 prevents or enables a physical movement of a portion of a user in contact with the virtual object in the virtual space. For example, if a user's finger is in contact with a virtual object (e.g., a virtual wall) in a virtual space, the haptic assembly 940 prevents a physical movement of the user finger to move in a direction through the virtual object in the virtual space. Accordingly, the user can receive a perception of contacting the virtual object.

In one embodiment, the haptic feedback signal indicates a position or a portion of the haptic assembly 940 to be actuated, and an amount of actuation of the position or the portion of the haptic assembly 940 for providing haptic feedback. In this embodiment, the amount of actuation is determined by, e.g., the console 910, according to a virtual position of the haptic assembly 940 corresponding to a physical position of the haptic assembly 940 and a virtual position of a virtual object in a virtual space. The haptic assembly 940 provides tactile perception of a user touching the virtual object according to the amount of actuation indicated by the haptic feedback signal.

The locators 970 are objects located in specific positions on the haptic assembly 940 relative to one another and relative to a specific reference point of the haptic assembly 940 on the haptic assembly 940. A locator 970 is substantially similar to a locator 920 except that a locator 970 is part of the haptic assembly 940. Additionally, in some embodiments, the outer surface or other portions of the haptic assembly 940 are opaque in the visible band of wavelengths of light. Thus, the locators 970 may emit light in the IR band under an outer surface that is transparent in the IR band but opaque in the visible band.

A position sensor 975 generates one or more measurement signals in response to motion of the haptic assembly 940. The position sensors 975 are substantially similar to the positions sensors 925, except that the position sensors 975 are part of the haptic assembly 940. The position sensors 975 may be located external to the IMU 980, internal to the IMU 980, or some combination thereof.

Based on the one or more measurement signals from one or more position sensors 975, the IMU 980 generates fast calibration data of the haptic assembly 940 indicating an estimated position of the haptic assembly 940 relative to an initial position of the haptic assembly 940. For example, the position sensors 975 include multiple accelerometers to measure translational motion (forward/back, up/down, left/right) and multiple gyroscopes to measure rotational motion (e.g., pitch, yaw, roll) of the haptic assembly 940. In some embodiments, the IMU 980 rapidly samples the measurement signals and calculates the estimated position of the haptic assembly 940 from the sampled data. For example, the IMU 980 integrates the measurement signals received from the accelerometers over time to estimate a velocity vector and integrates the velocity vector over time to determine an estimated position of a reference point of the haptic assembly 940. Alternatively, the IMU 980 provides the sampled measurement signals to the console 910, which determines the fast calibration data of the haptic assembly 940. The reference point of the haptic assembly 940 is a point that may be used to describe the position of the haptic assembly 940. While the reference point of the haptic assembly 940 may generally be defined as a point in space; however, in practice the reference point of the haptic assembly 940 is defined as a point within the haptic assembly 940 (e.g., a center of the IMU 980).

The IMU 980 receives one or more calibration parameters of the haptic assembly 940 from the console 910. As further discussed below, the one or more calibration parameters of the haptic assembly 940 are used to maintain tracking of the haptic assembly 940. Based on a received calibration parameter of the haptic assembly 940, the IMU 980 may adjust one or more IMU parameters (e.g., sample rate). In some embodiments, certain calibration parameters of the haptic assembly 940 cause the IMU 980 to update an initial position of the reference point of the haptic assembly 940 so it corresponds to a next calibrated position of the reference point of the haptic assembly 940. Updating the initial position of the reference point of the haptic assembly 940 as the next calibrated position of the reference point of the haptic assembly 940 helps reduce accumulated error associated with the determined estimated position.

The console 910 provides media to the headset 905 for presentation to the user in accordance with information received from one or more of: the imaging device 935, the headset 905, and the haptic assembly 940. In the example shown in FIG. 1, the console 910 includes an application store 945, a tracking module 950, and a virtual reality (VR) engine 955. Some embodiments of the console 910 have different modules than those described in conjunction with FIG. 1. Similarly, the functions further described below may be distributed among components of the console 910 in a different manner than is described here.

The application store 945 stores one or more applications for execution by the console 910. An application is a group of instructions, that when executed by a processor, generates content for presentation to the user. Content generated by an application may be in response to inputs received from the user via movement of the headset 905 or the haptic assembly 940. Examples of applications include: gaming applications, conferencing applications, video playback application, or other suitable applications.

The tracking module 950 calibrates the VR system 100 using one or more calibration parameters and may adjust one or more calibration parameters to reduce error in determination of the position of the headset 905. For example, the tracking module 950 adjusts the focus of the imaging device 935 to obtain a more accurate position for observed locators on the headset 905. Moreover, calibration performed by the tracking module 950 also accounts for information received from the IMU 930. Additionally, if tracking of the headset 905 is lost (e.g., the imaging device 935 loses line of sight of at least a threshold number of the locators 920), the tracking module 950 re-calibrates some or all of the system environment 100.

The tracking module 950 tracks movements of the headset 905 using slow calibration information from the imaging device 935. The tracking module 950 determines positions of a reference point of the headset 905 using observed locators from the slow calibration information and a model of the headset 905. The tracking module 950 also determines positions of a reference point of the headset 905 using position information from the fast calibration information. Additionally, in some embodiments, the tracking module 950 may use portions of the fast calibration information, the slow calibration information, or some combination thereof, to predict a future location of the headset 905. The tracking module 950 provides the estimated or predicted future position of the headset 905 to the VR engine 955.

The VR engine 955 executes applications within the system environment 100 and receives position information, acceleration information, velocity information, predicted future positions, or some combination thereof of the headset 905 from the tracking module 950. Based on the received information, the VR engine 955 determines content to provide to the headset 905 for presentation to the user. For example, if the received information indicates that the user has looked to the left, the VR engine 955 generates content for the headset 905 that mirrors the user's movement in a virtual environment. Additionally, the VR engine 955 performs an action within an application executing on the console 910 in response to an action request received from the haptic assembly 940 and provides feedback to the user that the action was performed. The provided feedback may be visual or audible feedback via the headset 905 or haptic feedback via the haptic assembly 940.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An electronic device for providing haptic feedback to a user, comprising:
   a flexible substrate configured to be worn by the user;
   an elastomer layer, supported by the flexible substrate, comprising fluid-based actuators;
   a sensing layer supported by the flexible substrate and positioned between the elastomer layer and the flexible substrate, the sensing layer comprising one or more non-fluidic-based components, including at least one stretch-sensitive doped polymer sensor that: (i) is sensitive to elongation, and (ii) generates a change in electric potential in response to being stretched, the at least one stretch-sensitive doped polymer sensor being coupled with one or more of the fluid-based actuators via an electrical-fluidic junction; and an electronic circuit configured to operate the fluid-based actuators of the elastomer layer.

2. The electronic device of claim 1, wherein the flexible substrate comprises a substrate of a glove to be worn by the user.

3. The electronic device of claim 1, wherein the flexible substrate comprises at least one of: a polymer material, or a fabric cloth.

4. The electronic device of claim 1, wherein the elastomer layer comprises channels for transmission of fluid along at least a portion of the elastomer layer for operation of the fluid-based actuators.

5. The electronic device of claim 1, wherein the elastomer layer comprises a fluidic via for transmission of fluid across at least a portion of the elastomer layer for operation of the fluid-based actuators.

6. The electronic device of claim 1, wherein the sensing layer further comprises an elastomer having channels for operation of fluid-based sensing and routing circuits.

7. The electronic device of claim 1, wherein the non-fluidic-based components of the sensing layer comprise at least one of: elastomeric electrically resistive sensing circuits, or elastomeric capacitive sensing circuits.

8. The electronic device of claim 2, wherein the sensing layer is configured to sense a movement by a user's hand while the glove is worn by the user.

9. The electronic device of claim 1, wherein each of the fluid-based actuators is pneumatically controlled.

10. The electronic device of claim 9, wherein each of the fluid-based actuators is configured to provide a shearing deformation at a portion of the user's skin.

11. The electronic device of claim 2, wherein the at least one stretch-sensitive doped polymer sensor comprises a bend sensor configured to sense a bending movement of at least one of a hand or a finger of the user while the glove is worn by the user.

12. A haptic device for providing haptic feedback to a user, comprising:
a flexible substrate configured to be worn on a hand of the user;
an elastomer layer, supported by the flexible substrate, comprising fluid-based actuators for providing fluidic haptic feedback to the user;
a sensing layer, supported by the flexible substrate, comprising at least one of stretch-sensitive fluidic-based sensing circuits or stretch-sensitive non-fluidic-based sensing circuits that are (i) configured to generate a change in electric potential in response to being stretched upon movement of at least one of the hand or a finger of the user and (ii) coupled to one or more of the fluid-based actuators of the elastomer layer via an electrical-fluidic junction; and an electronic circuit configured to operate the fluid-based actuators of the elastomer layer.

13. The haptic device of claim 12, wherein the sensing layer comprises both the stretch-sensitive fluidic-based sensing circuits and the stretch-sensitive non-fluidic-based sensing circuits.

14. The haptic device of claim 12, wherein:
the sensing layer comprises the stretch-sensitive non-fluidic-based sensing circuits; and the stretch-sensitive non-fluidic-based sensing circuits comprise a doped polymer sensor.

15. The haptic device of claim 12, wherein the fluidic haptic feedback comprises a tactile perception of touching a virtual object.

16. A virtual reality system, comprising:
a virtual reality headset configured to display a virtual object in a virtual reality environment, augmented reality environment, mixed reality environment, or a combination thereof,
a haptic glove, comprising:
an elastomer layer comprising fluid-based actuators for providing fluidic haptic feedback to a user of the virtual reality system; and
a sensing layer comprising at least one of stretch-sensitive fluidic-based sensing circuits or stretch-sensitive non-fluidic-based sensing circuits that are (i) configured to generate a change in electric potential in response to being stretched upon movement of at least one of the hand or a finger of the user and (ii) coupled to one or more of the fluid-based actuators of the elastomer layer via an electrical-fluidic junction; and
an electronic circuit configured to operate the fluid-based actuators of the elastomer layer of the haptic glove based on data provided by the virtual reality headset.

17. The virtual reality system of claim 16, wherein the virtual reality headset is configured to send instructions to the haptic glove to operate the fluid-based actuators of the elastomer layer to provide the perception of interacting with a virtual object viewed by the user on the virtual reality headset.

18. The virtual reality system of claim 16, further comprising an imaging device configured to capture images including positions of locators on at least one of: the virtual reality headset or the haptic glove.

19. The virtual reality system of claim 12, wherein the sensing layer of the haptic glove comprises a stretch-sensitive doped polymer.

20. The virtual reality system of claim 16, wherein:
the haptic glove further comprises an electronic circuit layer comprising the electronic circuit; and
the electronic circuit layer is physically coupled to at least one of: the elastomer layer or the sensing layer.

* * * * *